United States Patent
Park

(10) Patent No.: US 9,768,032 B2
(45) Date of Patent: Sep. 19, 2017

(54) METHOD OF FORMING PATTERN AND METHOD OF MANUFACTURING INTEGRATED CIRCUIT DEVICE BY USING THE SAME

(71) Applicant: SAMSUNG ELECTRONICS CO., LTD., Suwon-si, Gyeonggi-do (KR)

(72) Inventor: Seok-han Park, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/083,321

(22) Filed: Mar. 29, 2016

(65) Prior Publication Data

US 2016/0336192 A1 Nov. 17, 2016

(30) Foreign Application Priority Data

May 12, 2015 (KR) .................... 10-2015-0066253

(51) Int. Cl.
  *H01L 21/311* (2006.01)
  *H01L 21/033* (2006.01)
  *H01L 21/3213* (2006.01)
  *H01L 21/02* (2006.01)
  *H01L 27/108* (2006.01)

(52) U.S. Cl.
  CPC .... *H01L 21/31144* (2013.01); *H01L 21/0337* (2013.01); *H01L 21/32139* (2013.01); *H01L 21/02118* (2013.01); *H01L 21/31133* (2013.01); *H01L 27/10847* (2013.01); *H01L 27/10897* (2013.01)

(58) Field of Classification Search
  CPC ............. H01L 21/0337; H01L 21/0273; H01L 21/31144; H01L 21/0274; H01L 21/0338
  See application file for complete search history.

(56) References Cited

U.S. PATENT DOCUMENTS

| | | |
|---|---|---|
| 7,811,940 B2 | 10/2010 | Sandhu |
| 7,923,373 B2 | 4/2011 | Sandhu |
| 8,815,497 B2 | 8/2014 | Millward et al. |
| 8,900,467 B1 | 12/2014 | Chapuis et al. |
| 2009/0196488 A1 | 8/2009 | Nealey et al. |
| 2011/0117744 A1 | 5/2011 | Ito |

(Continued)

FOREIGN PATENT DOCUMENTS

JP   2008-036491 A   2/2008

*Primary Examiner* — Zandra Smith
*Assistant Examiner* — John M Parker
(74) *Attorney, Agent, or Firm* — Lee & Morse, P.C.

(57) ABSTRACT

A method of forming a pattern including forming a feature layer on a substrate having first and second regions; forming a first guide pattern on the first region, the first guide pattern having openings therein, the openings exposing the feature layer; forming a second guide pattern covering the feature layer exposed through the first guide pattern on the first region and covering the second region; forming a block copolymer layer covering the first guide pattern and the second guide pattern on the first and second regions; phase-separating the block copolymer layer to form first vertical domains and a second vertical domain; removing the first vertical domains on the first region; and etching the first guide pattern and the feature layer using the second vertical domain as an etch mask on the first region to form a feature pattern having holes therein.

20 Claims, 45 Drawing Sheets

(56) References Cited

U.S. PATENT DOCUMENTS

| | | |
|---|---|---|
| 2013/0236658 A1 | 9/2013 | Sato |
| 2014/0287083 A1 | 9/2014 | Gao et al. |
| 2014/0295669 A1 | 10/2014 | Kawanishi et al. |
| 2015/0303055 A1* | 10/2015 | Xu .................... H01L 21/0276 438/703 |

* cited by examiner

METHOD OF FORMING PATTERN AND METHOD OF MANUFACTURING INTEGRATED CIRCUIT DEVICE BY USING THE SAME

CROSS-REFERENCE TO RELATED APPLICATION

Korean Patent Application No. 10-2015-0066253, filed on May 12, 2015, in the Korean Intellectual Property Office, and entitled: "Method of Forming Pattern and Method of Manufacturing Integrated Circuit Device by Using the Same," is incorporated by reference herein in its entirety.

BACKGROUND

1. Field

Embodiments relate to a method forming a pattern and a method of manufacturing an integrated circuit device.

2. Description of the Related Art

According to the development of semiconductor industries and the requirements of users, the integration density of electronic devices may increase and the performance thereof may be improved. Accordingly, the high integration density and the high performance of semiconductor devices, which may be important components of electronic devices, may be required. As the integration density of semiconductor devices increases, an area of each unit cell in two dimensions may decrease. With a decrease in an area of a unit cell, feature sizes of semiconductor devices may decrease.

SUMMARY

Embodiments may be realized by providing a method of forming a pattern, the method including forming a feature layer on a substrate having a first region and a second region, the feature layer covering the first region and the second region; forming a first guide pattern on the first region, the first guide pattern having a plurality of openings therein, the plurality of openings exposing a plurality of first local regions of an upper surface of the feature layer, the first local regions being spaced apart from one another; forming a second guide pattern covering the feature layer exposed through the first guide pattern on the first region and covering the second region; forming a block copolymer layer covering the first guide pattern and the second guide pattern on the first region and the second region; phase-separating the block copolymer layer to form a plurality of first vertical domains and a second vertical domain, the plurality of first vertical domains being self-aligned on the plurality of first local regions and a plurality of second local regions between the plurality of first local regions using the second guide pattern as a guide, on the first region, the plurality of first vertical domains including a first polymer block, and the second vertical domain surrounding the plurality of first vertical domains on the first guide pattern, the second vertical domain including a second polymer block; removing the plurality of first vertical domains on the first region; and etching the first guide pattern and the feature layer using the second vertical domain as an etch mask on the first region to form a feature pattern having a plurality of holes therein.

In phase-separating the block copolymer layer, a layered structure, in which a first horizontal domain including the first polymer block and a second horizontal domain including the second polymer block are alternately self-assembled at least one time on the second guide pattern on the second region, may be formed at a same time as the plurality of first vertical domains and the second vertical domain are formed.

The layered structure may be formed such that the second horizontal domain is exposed on an upper surface of the layered structure, and in etching the feature layer, the second guide pattern and the feature layer may be etched using the second vertical domain and the second horizontal domain as an etch mask.

The first polymer block may include poly(methyl methacrylate), poly(ethylene oxide), poly(lactic acid), or polyisoprene, and the second polymer block may include polystyrene.

The first guide pattern may include a material having a relatively higher affinity for the second polymer block among the first polymer block and the second polymer block, and the second guide pattern may include a material having a relatively higher affinity for the first polymer block among the first polymer block and the second polymer block.

The first guide pattern may include polystyrene, and the second guide pattern may include poly(methyl methacrylate), poly(ethylene oxide), poly(lactic acid), or polyisoprene.

The block copolymer layer may include a pure block copolymer including the first polymer block and the second polymer block, the first polymer block may include poly(methyl methacrylate), poly(ethylene oxide), poly(lactic acid), or polyisoprene, and the second polymer block may include polyisoprene.

Forming the first guide pattern may include forming a first guide layer on the feature layer on the first region and the second region; forming a mask pattern having a plurality of openings therein, the plurality of openings in the mask pattern exposing a plurality of regions including portions of an upper surface of the first guide layer, which corresponds to the plurality of first local regions, on the first guide layer in the first region; forming a plurality of mask spacers covering sidewalls of the mask pattern in the first region; and etching the first guide layer in the first region and the second region using the mask pattern and the plurality of mask spacers as an etch mask to form the first guide pattern in the first region and remove the first guide layer in the second region.

The first guide layer and each of the plurality of mask spacers may include polyisoprene.

The first guide layer and the plurality of mask spacers may include different materials.

The plurality of first local regions may form a hexagonal array in which the plurality of first local regions are regularly arranged with a first pitch, and the plurality of holes formed in the feature pattern may form a hexagonal array in which the plurality of holes are regularly arranged with a second pitch that is less than the first pitch.

Embodiments may be realized by providing a method of manufacturing an integrated circuit device, the method including forming a feature layer on a substrate having a cell array region and a peripheral circuit region, the feature layer covering the cell array region and the peripheral circuit region; forming a first guide pattern having a plurality of openings therein, the plurality of openings exposing a plurality of first local regions of an upper surface of the feature layer in the cell array region, the plurality of first local regions being spaced apart from one another; forming a second guide pattern covering the feature layer exposed through the first guide pattern in the cell array region and covering the peripheral circuit region; forming a block copolymer layer covering the first guide pattern and the second guide pattern in the cell array region and the peripheral circuit region; phase-separating the block copolymer layer to form a plurality of first vertical domains and a second vertical domain, the second vertical domain surrounding the plurality of first vertical domains, in the cell array region and to form a layered structure, in which a first horizontal domain and a second horizontal domain are alternately self-assembled in a direction away from the substrate, in the peripheral circuit region; removing the plurality of first vertical domains; and etching the first guide pattern and the feature layer using the second vertical domain and the layered structure as an etch mask to form a feature pattern having a plurality of holes therein in the cell array region.

The second guide pattern, the first vertical domain, and the first horizontal domain each may include a first polymer, and the first guide pattern, the second vertical domain, and the second horizontal domain each may include a second polymer having a structure that is different from that of the first polymer.

Forming the first guide pattern may include forming a first guide layer on the feature layer in the cell array region, the first guide layer including a polymer having a same structure as a polymer included in the second vertical domain; forming a mask pattern on the first guide layer; forming a plurality of mask spacers covering sidewalls of the mask pattern; and etching the first guide layer using the mask pattern and the plurality of mask spacers as an etch mask to expose a portion of the feature layer.

The method may further include forming a mold layer on the substrate before etching the feature layer, and after etching the feature layer, forming a plurality of holes, the plurality of holes penetrating the mold layer, by etching the mold layer using the feature pattern as an etch mask; and forming a plurality of electrodes in the plurality of holes.

Embodiments may be realized by providing a method of manufacturing a semiconductor device, the method including forming a first guide pattern on a first region of a substrate, the first guide pattern having a plurality of openings therein, the first guide pattern including polystyrene; forming a second guide pattern in the plurality of openings in the first guide pattern on the first region and covering a second region of the substrate, the second guide pattern including poly(methyl methacrylate); forming a block copolymer layer covering the first guide pattern and the second guide pattern on the first region and the second region; phase-separating the block copolymer layer to form a phase-separated block copolymer including a plurality of first vertical domains and a second vertical domain on the first region, the plurality of first vertical domains including a first polymer block, the second vertical domain surrounding the plurality of first vertical domains, the second vertical domain including a second polymer block; and a layered structure on the second region, the layered structure including a first horizontal domain including the first polymer block and a second horizontal domain on the first horizontal domain, the second horizontal domain including the second polymer block; and selectively removing the plurality of first vertical domains on the first region.

Selectively removing the plurality of first vertical domains on the first region may include selectively decomposing the plurality of first vertical domains by applying a polymer decomposer to the phase-separated block copolymer, and stripping off decomposed first vertical domains using a cleaning solution.

The polymer decomposer may include radiant rays or plasma.

A volume ratio of the first polymer block to the second polymer block in the block copolymer may be about 20:80 to about 40:60.

The first polymer block may be poly(methyl methacrylate); and the second polymer block may be polystyrene.

BRIEF DESCRIPTION OF THE DRAWINGS

Features will become apparent to those of skill in the art by describing in detail exemplary embodiments with reference to the attached drawings in which:

FIGS. 4A and 4B through FIGS. 13A and 13B sequentially illustrate views of a method of manufacturing an integrated circuit device, according to an exemplary embodiment;

DETAILED DESCRIPTION

Figure 1A:
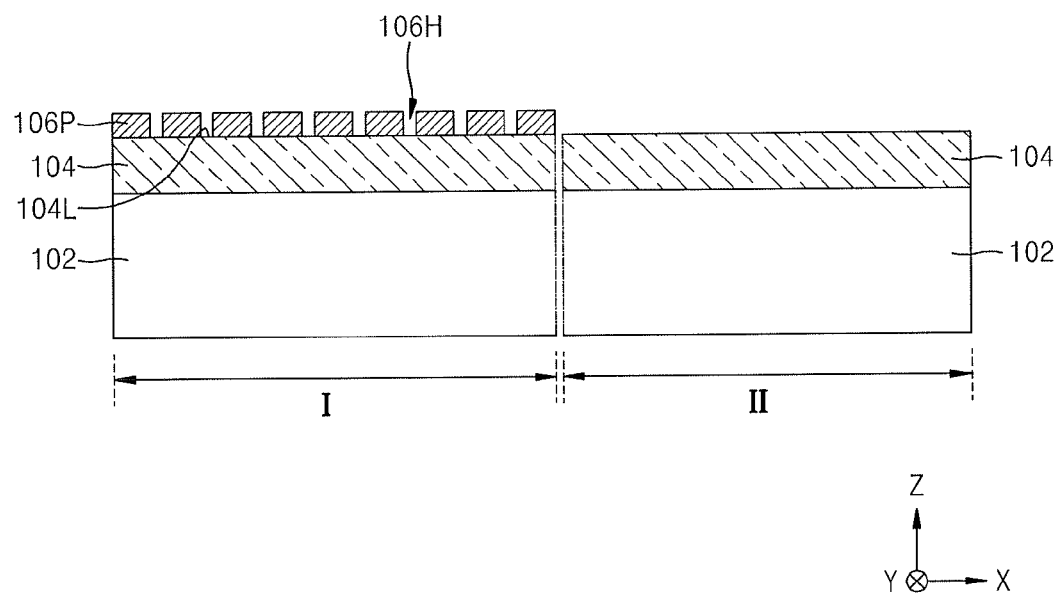
FIGS. 1A through 1G sequentially illustrate cross-sectional views of a method of forming a pattern, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various members, regions, layers, parts, and/or elements, these members, regions, layers, parts, and/or elements should not be limited by these terms. These terms are only used to distinguish one member, region, layer, part, or element from another member, region, layer, part, or element. Thus, a first member, region, part, or element discussed below could be termed a second member, region, part, or element without departing from the teachings of exemplary embodiments. For example, a first element may be referred to as a second element, and likewise, a second element may be referred to as a first element.

All terms including technical and scientific terms used herein have meanings which can be generally understood by those of skill in the art, if the terms are not particularly defined. General terms defined by dictionaries should be understood to have meanings which can be contextually understood in the art and should not have ideally or excessively formal meanings, if the terms are not defined particularly herein.

A specific process order may be changed in another embodiment. For example, two processes which are described as being continuously performed may be simultaneously performed or may be performed in a reverse order.

As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. As used herein, the term "and/or" includes any and all combinations of one or more of the associated listed items. The term "substrate" may mean a substrate itself or a stack structure including a substrate and a predetermined layer or film formed on the surface of the substrate. In addition, the term "surface of a substrate" may mean an exposed surface of a substrate itself or an outer surface of a predetermined layer or film formed on the substrate.

FIGS. 1A through 1G sequentially illustrate cross-sectional views of a method of forming a pattern, according to an exemplary embodiment.

Referring to FIG. 1A, a feature layer 104 may be formed on a substrate 102, and a first guide pattern 106P having a plurality of openings 106H formed therein may be formed on the feature layer 104.

The substrate 102 may be a semiconductor substrate. In some exemplary embodiments, the substrate 102 may include a semiconductor such as silicon (Si) or germanium (Ge). In some other exemplary embodiments, the substrate 102 may include a Group III-V material. The Group III-V material may be a binary compound, a ternary compound, or a quaternary compound, which may include at least one Group III element and at least one Group V element. The Group III-V material may be a compound that may include one or more of In, Ga, or Al as a Group III element and one or more of As, P, or Sb as a Group V element. For example, the Group III-V material may be InP, $In_zGa_{1-z}As$ ($0 \leq z \leq 1$), or $Al_zGa_{1-z}As$ ($0 \leq z \leq 1$). The binary compound may be, for example, one of InP, GaAs, InAs, InSb, or GaSb. The ternary compound may be, for example, one of InGaP, InGaAs, AlInAs, InGaSb, GaAsSb, or GaAsP. In some other exemplary embodiments, the substrate 102 may have a silicon on insulator (SOI) structure. The substrate 102 may include a conductive region, for example, a well doped with impurities or a structure doped with impurities. The substrate 102 may have any of various device isolation structures such as a shallow trench isolation (STI) structure.

The substrate 102 may include a first region I and a second region II. The first region I may be a high-density region having a relatively high pattern density, and the second region II may be a low-density region having a relatively low pattern density. In some exemplary embodiments, the first region I may be a cell array region of a semiconductor memory device. For example, a volatile memory cell array, such as dynamic random access memory (DRAM), or a non-volatile memory cell array, such as a flash memory, may be formed in the first region I. Peripheral circuits electrically connected to cell arrays formed in the first region I may be formed in the second region II. The second region II may include a region in which a cell array may not be formed, like a core region. Hereinafter, the term "peripheral circuit region" means a region in which the peripheral circuits are formed or a core region.

The feature layer 104 may cover the first region I and the second region II of the substrate 102.

The feature layer 104 may be an insulating film or a conductive film. For example, the feature layer 104 may include, for example, a metal, an alloy, metal carbide, metal nitride, metal oxynitride, metal oxycarbide, a semiconductor, polysilicon, oxide, nitride, oxynitride, hydrocarbon, or a combination thereof. When a pattern that is to be finally formed is formed on the substrate 102, the feature layer 104 may be omitted.

The first guide pattern 106P may be formed on the first region I of the substrate 102, but may not be formed on the second region II of the substrate 102.

A plurality of local regions 104L, spaced apart from each other, of the upper surface of the feature layer 104 may be exposed through the plurality of openings 106H formed in the first guide pattern 106P.

The first guide pattern 106P may include a material having a relatively higher affinity for a second polymer block among a first polymer block and the second polymer block, which may be included in a block copolymer layer 130 to be described with reference to FIG. 1C.

In some exemplary embodiments, the first guide pattern 106P may include a polymer layer including polystyrene (PS) as a main component. In some exemplary embodiments, the polymer layer for forming the first guide pattern 106P may be formed by using cross-linked PS (X-PS). The first guide pattern 106P may include a polymer layer including the X-PS as a main component.

In some exemplary embodiments, the first guide pattern 106P may have a thickness of, for example, about 2 nm to about 15 nm.

A spin coating process and a photolithography process may be used in an example for forming the first guide pattern 106P. For example, a PS solution including PS-OH dissolved in an organic solvent, such as toluene or propylene glycol methyl ether acetate (PGMEA), may be spin-coated on the feature layer 104, and heat-treated for about 5 minutes to about 24 hours at a temperature of about 180° C. to about 250° C. under a vacuum atmosphere or a nitrogen atmosphere to form a PS layer on the feature layer 104, and then, an unreacted portion of the PS solution may be removed. An organic solvent may be used to remove the unreacted portion of the PS solution. Examples of the organic solvent may include, for example, PGMEA, propylene glycol monomethyl ester (PGME), ethyl-3-ethoxy propionate (EEP), ethyl lactate (EL), methyl 2-hydroxybutyate (HBM), and gamma-butyrolactone (GBL).

Next, the PS layer may be patterned by using a photolithography process to form the first guide pattern 106P.

FIGS. 2A through 2F sequentially illustrate cross-sectional views of a method of forming the first guide pattern 106P illustrated in FIG. 1A, according to an exemplary embodiment.

Figure 2A:
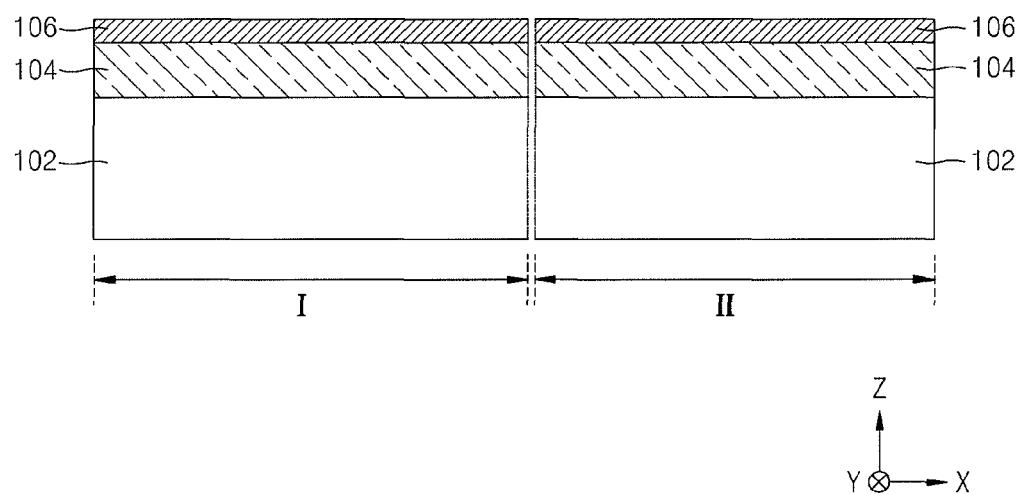
FIGS. 2A through 2F sequentially illustrate cross-sectional views of a method of forming a first guide pattern illustrated in FIG. 1A, according to an exemplary embodiment.

Referring to FIG. 2A, after the feature layer 104 is formed on the substrate 102, as described with reference to FIG. 1A, a first guide layer 106 may be formed on the feature layer 104 on the first region I and the second region II.

The first guide layer 106 may be a polymer layer including X-PS as a main component. In some exemplary embodiments, the first guide layer 106 may have a thickness of, for example, about 2 nm to about 15 nm.

Figure 2B:
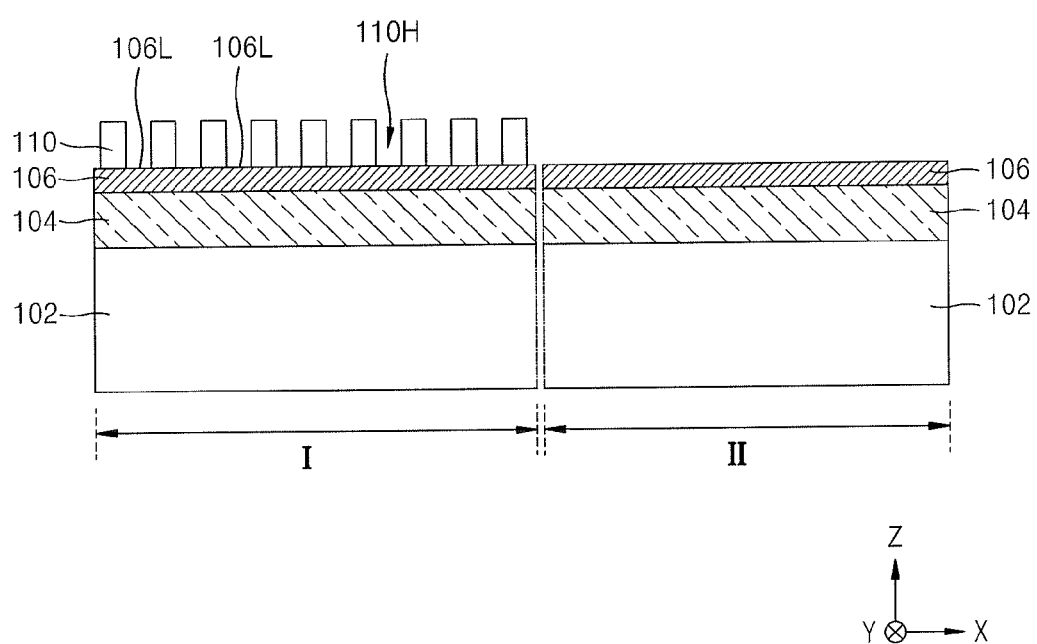

Referring to FIG. 2B, a mask pattern 110 may be formed on the first guide layer 106 on the first region I. The mask pattern 110 may have a plurality of openings 110H that may expose a plurality of regions 106L including portions of the upper surface of the first guide layer 106, which correspond to the plurality of local regions 104L.

The mask pattern 110 may be a photoresist pattern. In some exemplary embodiments, the mask pattern 110 may be formed of a resist for a KrF excimer laser (with a wavelength of 248 mm), a resist for an ArF excimer laser (with a wavelength of 193 nm), a resist for a $F_2$ excimer laser (with a wavelength of 157 nm), or a resist for an extreme ultraviolet (EUV) light (with a wavelength of 13.5 nm).

Figure 2C:
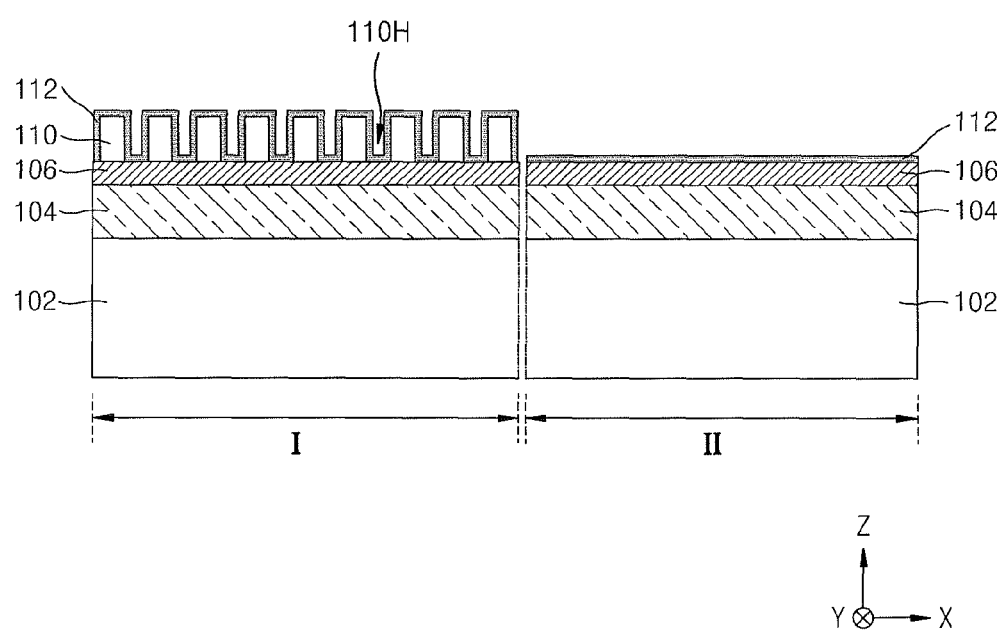

Referring to FIG. 2C, a mask spacer layer 112 may be formed on the first region I and may cover an exposed surface of the mask pattern 110, which may include sidewalls of the mask pattern 110, and an exposed surface of the first guide layer 106.

The mask spacer layer 112 may also be formed on the second region II.

In some exemplary embodiments, the mask spacer layer 112 may include a material that is the same as a constituent material of the first guide layer 106. For example, the first guide layer 106 and the mask spacer layer 112 each may be a polymer layer including PS as a main component. To form the mask spacer layer 112, a PS solution including PS-OH dissolved in an organic solvent may be spin-coated on a resultant structure including the mask pattern 110 formed thereon, and the spin-coated PS solution is heat-treated for about 5 minutes to about 24 hours at a temperature of about 180° C. to about 250° C. under a vacuum atmosphere or a nitrogen atmosphere to form a PS spacer layer on the mask pattern 110, and then, an unreacted portion of the PS solution may be removed.

When the first guide layer 106 and the mask spacer layer 112 each includes PS as a main component, the mask spacer layer 112 may be formed only on an exposed surface of the mask pattern 110, but may not be formed on an exposed surface of the first guide layer 106.

In some other exemplary embodiments, the mask spacer layer 112 may include a material that is different from a constituent material of the first guide layer 106. For example, the mask spacer layer 112 may include oxide, nitride, or polysilicon. An atomic layer deposition (ALD) process may be used to form the mask spacer layer 112.

The mask spacer layer 112 may be formed so as not to completely fill the plurality of openings 110H, and after the mask spacer layer 112 is formed, the plurality of openings 110H may be exposed to the outside.

Figure 2D:
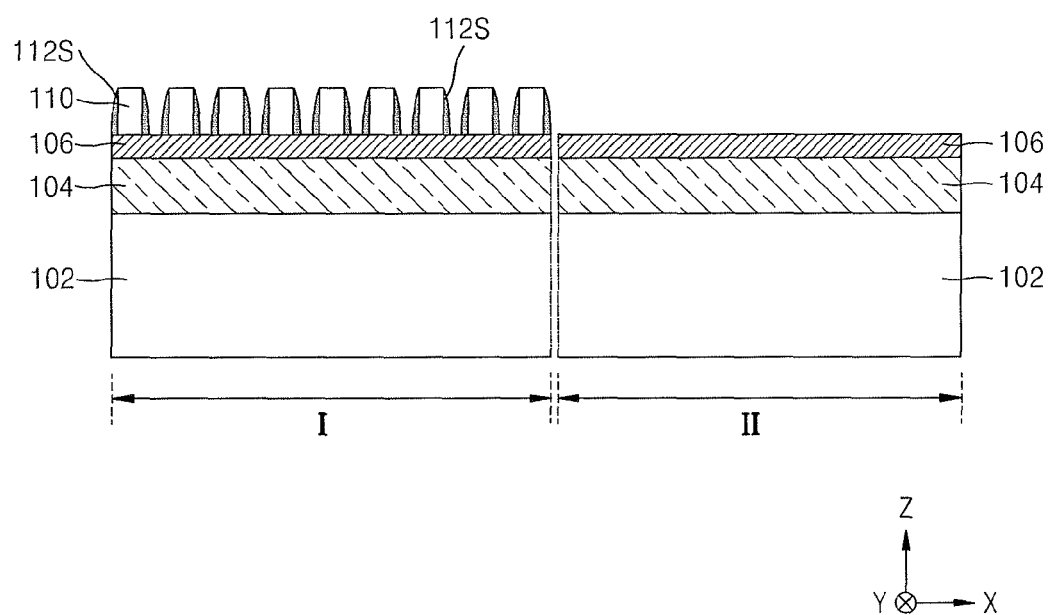

Referring to FIG. 2D, an etch-back process may be performed on the mask spacer layer 112, and a plurality of mask spacers 112S may be formed covering the sidewalls of the mask pattern 110.

After the plurality of mask spacers 112S are formed, the upper surface of the first guide layer 106 may be exposed via the plurality of mask spacers 112S.

Figure 2E:
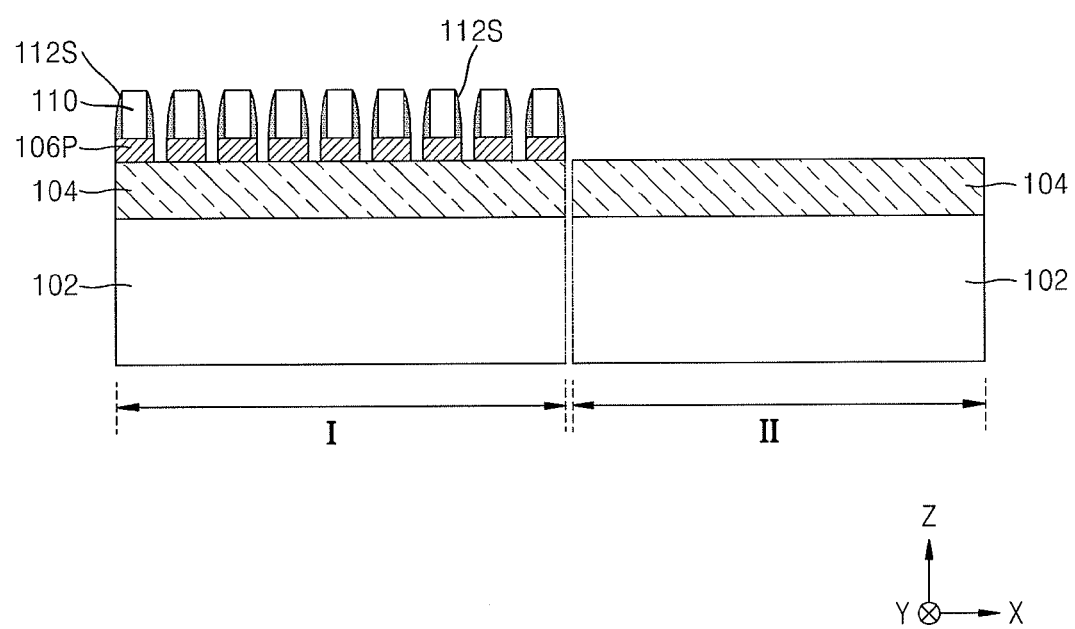

Referring to FIG. 2E, in the first region I and the second region II, the first guide layer 106 (refer to FIG. 2D) may be etched by using the mask pattern 110 and the plurality of mask spacers 112S as an etch mask, in the first region I, the first guide pattern 106P as illustrated in FIG. 1A may be formed, and in the second region II, the first guide layer 106 may be removed to expose the feature layer 104.

Figure 2F:
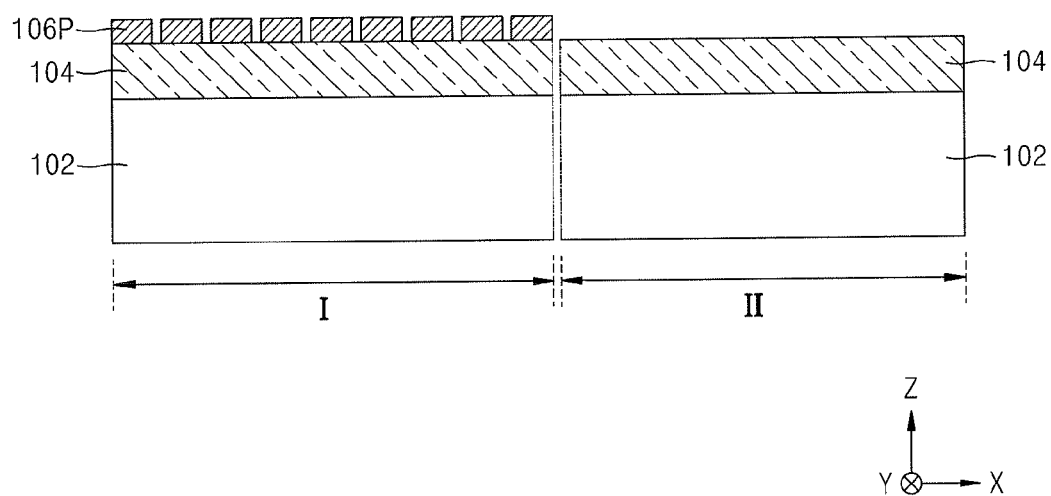

Referring to FIG. 2F, in the first region I, unnecessary materials, which may include the mask pattern 110 and the plurality of mask spacers 112S which may remain on the first guide pattern 106P, may be removed to expose the upper surface and the sidewalls of the first guide pattern 106P.

In some exemplary embodiments, a wet etch process may be used to remove the mask pattern 110 and the plurality of mask spacers 112S. For example, when the mask pattern 110 includes photoresist, the mask pattern 110 and the plurality of mask spacers 112S may be removed by using N-methyl pyrrolidone (NMP) and ultrasound. When the plurality of mask spacers 112S are each a polymer layer including PS as a main component, the plurality of mask spacers 112S may also be removed while the mask pattern 110 is removed by using NMP. Any of various methods may be used to remove the mask pattern 110 and the plurality of mask spacers 112S.

An exemplary method of forming the first guide pattern 106P illustrated in FIG. 1A has been described with reference to FIGS. 2A through 2F. In an embodiment, the first guide pattern 106P may be formed by any of various methods.

Figure 1B:
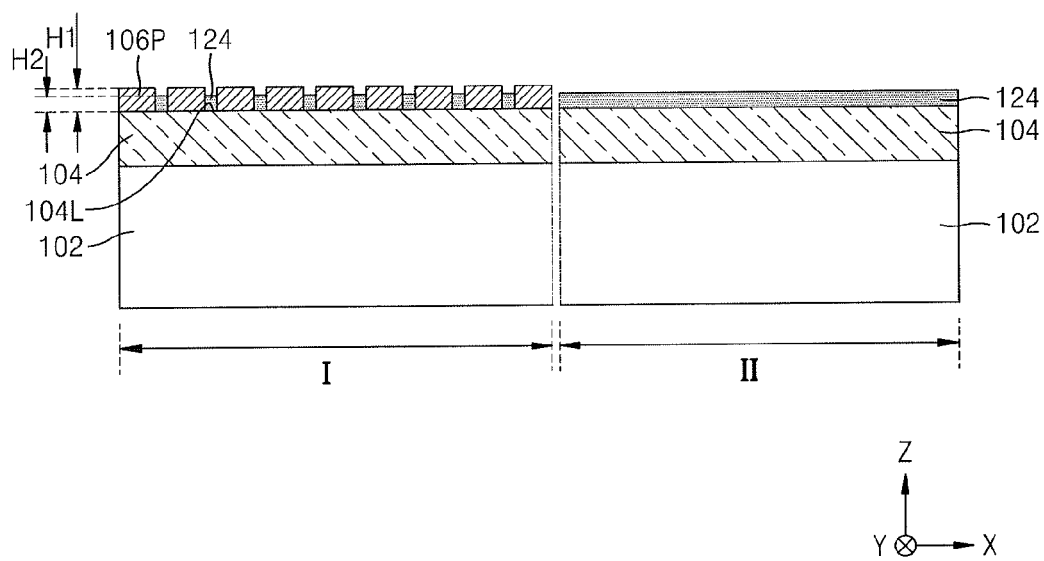

Referring to FIG. 1B, in the first region I and the second region II, a second guide pattern 124 may be formed to cover the feature layer 104 exposed through the first guide pattern 106P.

The second guide pattern 124 may include a material having a relatively higher affinity for the second polymer block among the first polymer block and the second polymer block, which may be included in a block copolymer layer 130 to be described with reference to FIG. 1C.

In some exemplary embodiments, the second guide pattern 124 may include polymer including poly(methyl methacrylate) (PMMA), poly(ethylene oxide) (PEO), poly(lactic acid) (PLA), or polyisoprene (PI) as a main component.

A spin coating process may be used in an example for forming the second guide pattern 124. For example, a PMMA solution including hydroxyl-terminated PMMA (PMMA-OH) dissolved in an organic solvent, such as toluene or PGMEA, may be spin-coated on the resultant structure of FIG. 1A which may include the first guide pattern 106P formed therein, and the resultant structure coated with the PMMA solution may be heat-treated for about 5 minutes to about 24 hours at a temperature of about 180° C. to about 250° C. under a vacuum atmosphere or a nitrogen atmosphere to form a PMMA layer on a surface of the feature layer 104, which may be exposed through the first guide pattern 106P, and then, an unreacted portion of the PMMA solution may be removed. An organic solvent may be used to remove the unreacted portion of the PMMA solution. Examples of the organic solvent may include PGMEA, PGME, EEP, EL, HBM, and GBL.

The second guide pattern 124 may be formed only on a surface of the feature layer 104, which contacts the PMMA solution, by using, as an anchoring group, hydroxyl of the PMMA-OH included in the PMMA solution, and may not be formed on the first guide pattern 160P. The second guide pattern 124 may be formed by using a method of forming a covalent bond through condensation reaction.

In the first region I, the height H2 of the second guide pattern 124 may be less than the height H1 of the first guide pattern 106P. By this structure, vertical orientation characteristics of domains may be improved when a block copolymer on the first and second guide patterns 106P and 124 is phase-separated into a plurality of polymer blocks in a subsequent process. In an embodiment, the height H2 of the second guide pattern 124 is less than the height H1 of the first guide pattern 106P. In an embodiment, the height of the second guide pattern 124 may be the same as that of the first guide pattern 106P.

Figure 1C:
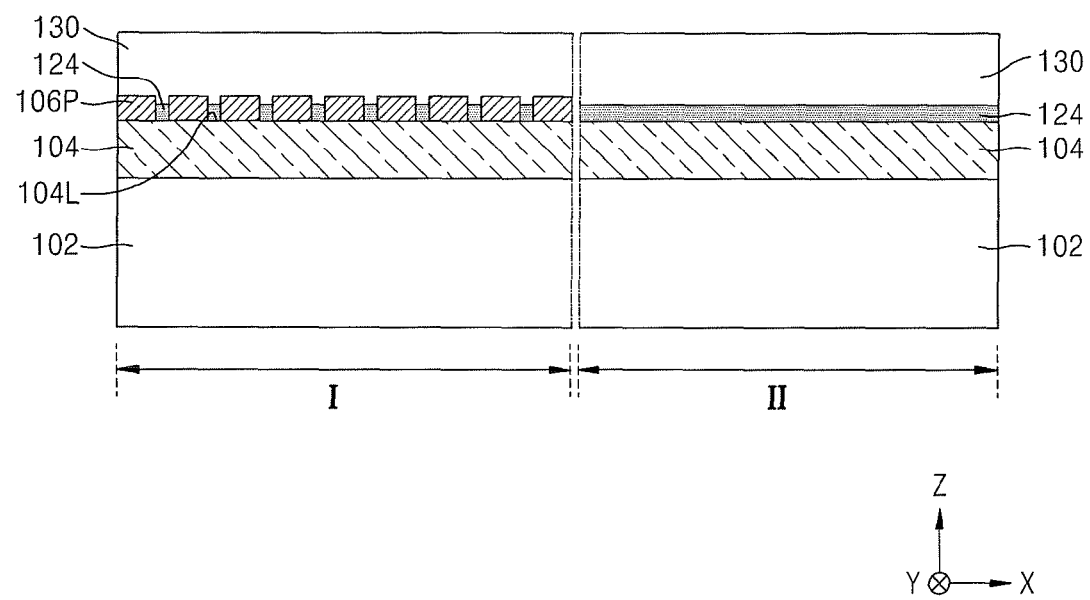

Referring to FIG. 1C, in the first region I and the second region II, the block copolymer layer 130 may be formed on the first guide pattern 106P and the second guide pattern 124.

The block copolymer layer 130 may be a pure block copolymer including a first polymer block having a first repeating unit and a second polymer block having a second repeating unit. In some exemplary embodiments, the pure block copolymer may include a linear or branched polymer having a molecular weight of about 3,000 to about 2,000,000 g/mol. In the pure block copolymer, the first polymer block may be PMMA, PEO, PLA, or PI, and the second polymer block may be PS.

In the block copolymer layer 130, the first polymer block may form a minor block and the second polymer block may form a major block. In some exemplary embodiments, a volume ratio of the first polymer block to the second polymer block in the pure block copolymer may be about 20:80 to about 40:60.

In some exemplary embodiments, the pure block copolymer may be applied onto the first and second guide patterns 106P and 124 in the first and second regions I and II, respectively, to form the block copolymer layer 130. For example, the block copolymer layer 130 may be formed by using a dip coating, solution casting, or spin-coating process.

Figure 1D:
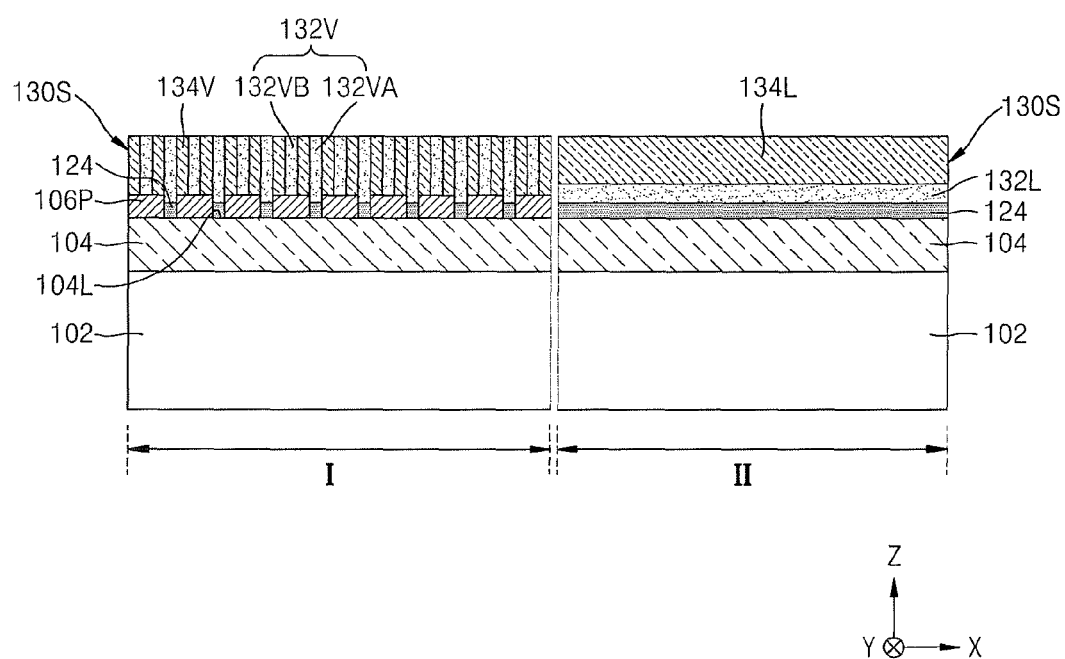

Referring to FIG. 1D, the block copolymer layer 130 (refer to FIG. 1C) may be phase-separated to form a self-assembled layer 130S that may include a plurality of first domains 132V and 132L including the first polymer block and a plurality of second domains 134V and 134L including the second polymer block.

The plurality of first domains 132V and 132L of the self-assembled layer 130S may include a first polymer block having a relatively higher affinity for the second guide pattern 124 between the first guide pattern 106P and the second guide pattern 124. The first polymer block may include PMMA, PEO, PLA, or PI.

The plurality of second domains 134V and 132L of the self-assembled layer 130S may include a second polymer block having a relatively higher affinity for the first guide pattern 106P among the first guide pattern 106P and the second guide pattern 124. The second polymer block may include PS.

The plurality of first domains 132V and 132L may include a first vertical domain 132V including vertical domains 132VA and 132VB self-aligned so as to be vertically oriented in the first region I, and a first horizontal domain 132L that may be formed on the second guide pattern 124 in the second region II and may extend in a horizontal direction (a direction parallel to an X-Y plane in FIG. 1D) parallel to the substrate 102.

The first vertical domain 132V may include the vertical domain 132VA and the vertical domain 132VB. In the first region I, the vertical domain 132VA may be self-aligned so as to be vertically oriented on the second guide pattern 124 on the plurality of local regions 104L of the feature layer 104 by using the second guide pattern 124 as a guide. The vertical domain 132VB may be self-aligned so as to be vertically oriented between two or three vertical domains 132VA that may be formed on the first guide pattern 106P between the plurality of local regions 104L and may be adjacent to each other.

The plurality of second domains 134V and 134L may include a second vertical domain 134V self-aligned so as to be vertically oriented on the first guide pattern 106P while surrounding the plurality of first vertical domains 132VA and 132VB in the first region I, and a second horizontal domain 134L that may be formed on the first horizontal domain 132L in the second region II and may extend in the horizontal direction (the direction parallel to the X-Y plane in FIG. 1D) parallel to the substrate 102.

In the second region II, a layered structure, in which the first horizontal domain 132L and the second horizontal domain 134L may be alternately self-assembled at least one time in a direction away from the substrate 102, may be formed.

In the second region II, a pattern for guiding the first and second polymer blocks obtained as a result of the phase-separation of the block copolymer layer 130 (refer to FIG. 1C) may not be formed over a relatively large area. Thus, when the block copolymer layer 130 is phase-separated, the first horizontal domain 132L, which may includes the first polymer block having a relatively higher affinity for the second guide pattern 124 that may contact the block copolymer layer 130, may be self-assembled in a layered structure form on the second guide pattern 124 in the second region II. Accordingly, the first horizontal domain 132L may be the lowest layer, which may be closest to the substrate 102, in the self-assembled layer 130S.

The second horizontal domain 134L may be self-assembled in a layered structure form on the first horizontal domain 132L. In this manner, the first horizontal domain 132L and the second horizontal domain 134L in the second region II may be alternately self-assembled in a direction away from the substrate 102. In the second region II, the second horizontal domain 134L including the second polymer block may be the highest layer of the self-assembled layer 130S, which is most distant, e.g., may be farthest, from the substrate 102.

In FIG. 1D, the self-assembled layer 130S may have a layered structure self-assembled to include one first horizontal domain 132L and one second horizontal domain 134L in the second region II. In an embodiment, the self-assembled layer 130S may have a layered structure in which a plurality of first horizontal domains 132L and a plurality of second horizontal domains 134L are stacked to be alternately self-assembled.

To perform the phase-separation of the block copolymer layer 130, the block copolymer layer 130 may be annealed at temperature that is higher than the glass transition temperature Tg of a block copolymer in the block copolymer layer 130. For example, to perform the phase-separation of the block copolymer layer 130, the block copolymer layer 130 may be annealed for about 1 hour to 24 hours at a temperature of about 130° C. to about 190° C.

Figure 1E:
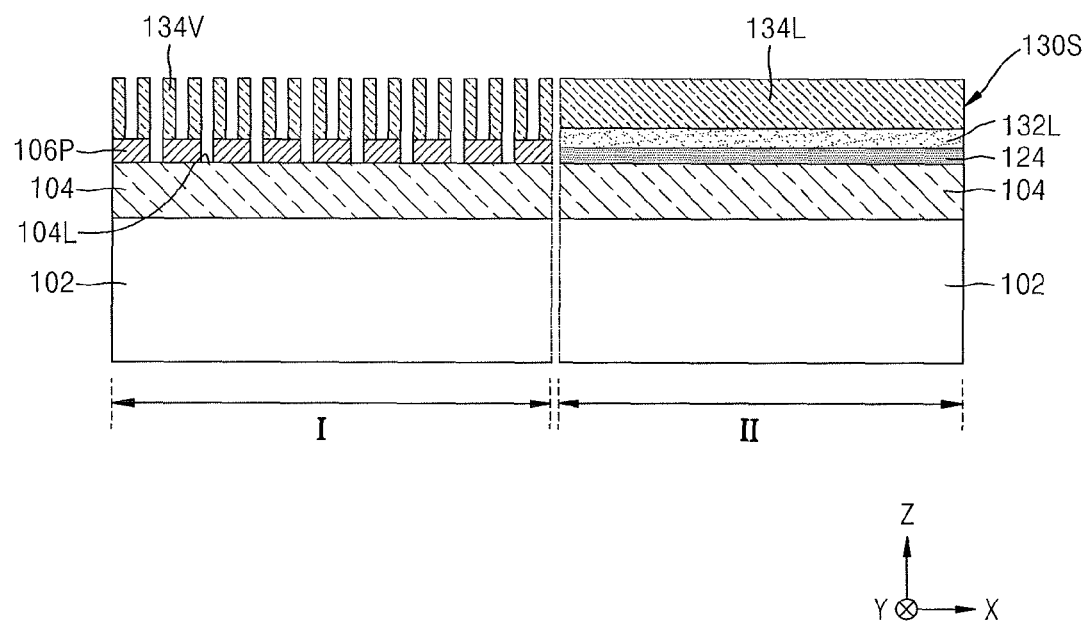

Referring to FIG. 1E, in the first region I, the plurality of first vertical domains 132V of the self-assembled layer 130S may be removed.

In some exemplary embodiments, in order to remove the plurality of first vertical domains 132V, the plurality of first vertical domains 132V may be selectively decomposed by applying a polymer decomposer to the self-assembled layer 130S, and then the decomposed first vertical domains 132V may be stripped off by using a cleaning solution, for example, isopropyl alcohol (IPA).

In some exemplary embodiments, radiant rays or plasma may be used as the polymer decomposer. The radiant rays may be provided under an oxygen atmosphere and may be deep ultraviolet (DUV) rays, soft X-rays, or E-beams. The plasma may be oxygen plasma. The type of polymer decomposer or the energy of the polymer decomposer may be determined to selectively decompose the plurality of first vertical domains 132V. For example, a first threshold energy, by which the composition of the first vertical domains 132V, exposed to the outside in the first region I, of the self-assembled layer 130S formed on the substrate 102 in the resultant structure of FIG. 1D, may start, and a second threshold energy, by which the decomposition of the second vertical domain 134V exposed to the outside in the first region I and the decomposition of the second horizontal domain 134L exposed to the outside in the second region II may start, may be different from each other. Accordingly, radiant rays or plasma having an energy that may selectively decompose the plurality of first vertical domains 132V, exposed to the outside in the first region I, of the self-assembled layer 130S may be applied to the self-assembled layer 130S. The energy of the radiant rays and the energy of the plasma may be adjusted by a radiant ray irradiation time and a plasma exposure time, respectively.

When the second guide pattern 124 and the plurality of first vertical domains 132V include the same material, the second guide pattern 124 may also be removed while the plurality of first vertical domains 132V may be removed.

Figure 1F:
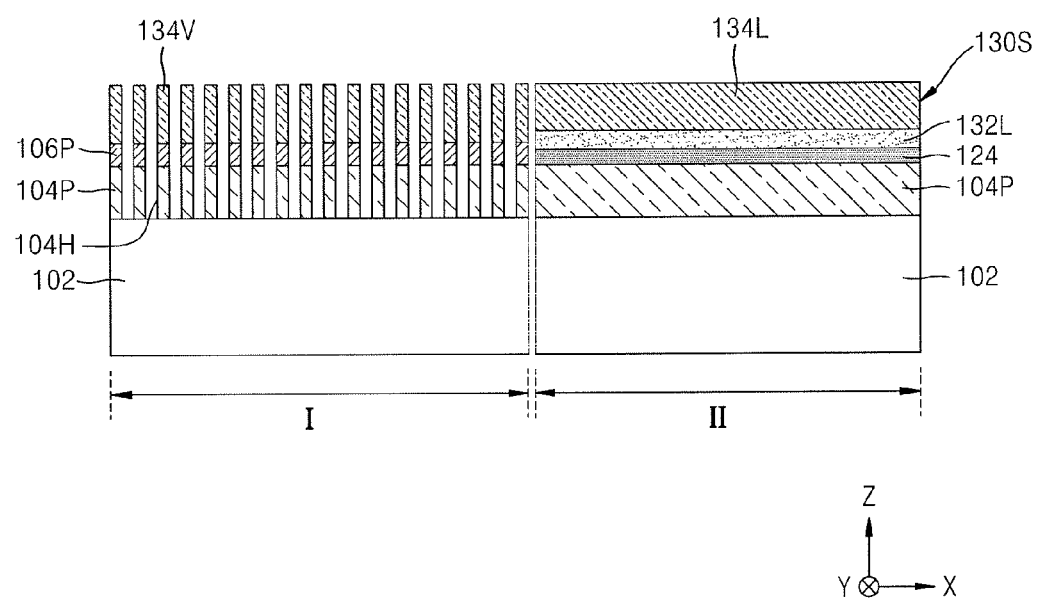

Referring to FIG. 1F, the first guide pattern 106P and the feature layer 104 are etched by using the second vertical domain 134V in the first region I and the second horizontal domain 134L in the second region II as an etch mask, and a feature pattern 104P having a plurality of holes 104H formed therein may be formed.

Figure 1G:
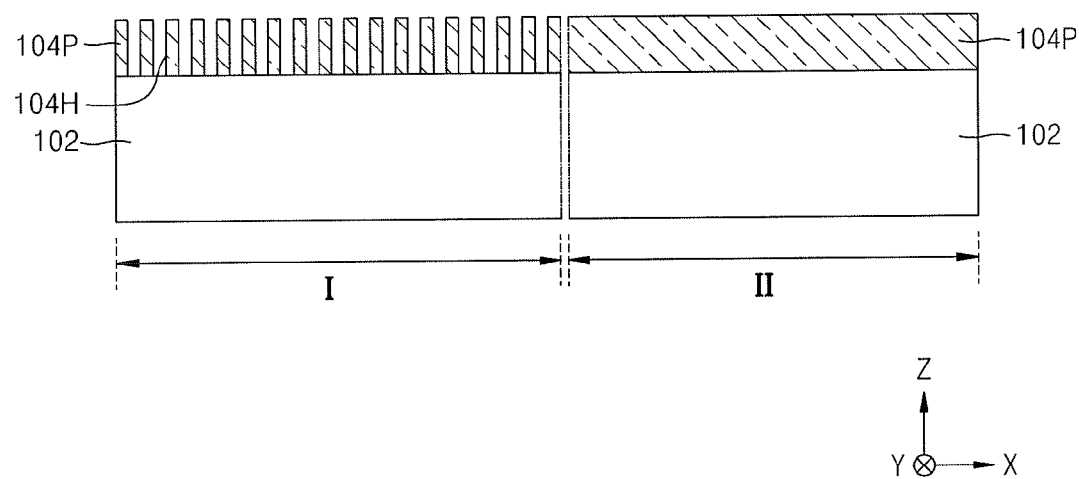

Referring to FIG. 1G, unnecessary layers remaining on the feature pattern 104P may be removed to expose the upper surface of the feature pattern 104P.

According to the pattern formation method described with reference to FIGS. 1A through 1G, the plurality of first vertical domains 132V, which are vertically oriented by using the second guide pattern 124 during the phase-separation of the block copolymer layer 130, and the second vertical domain 134V, which may surround the plurality of first vertical domains 132V, may be formed in the first region I, in which pattern density may be relatively high. In the second region II, in which pattern density may be relatively low, the first horizontal domain 132L, which may include the first polymer block having a relatively higher affinity for the second guide pattern 124 during the phase-separation of the block copolymer layer 130, may be self-assembled in a layered structure form on the second guide pattern 124. In a manner in which the second horizontal domain 134L is self-assembled in a layered structure form on the first horizontal domain 132L, the first horizontal domain 132L and the second horizontal domain 134L may be alternately self-assembled in a direction away from the substrate 102. By using the process described above, a vertical domain may be prevented from being unnecessarily formed in a region other than the first region I where a vertically oriented vertical domain may be required, and an effective area, which may be necessary for forming a device on the substrate 102, may be effectively used. A trimming process for removing an unnecessary pattern that may be incidentally formed due to, for example, an unnecessarily formed vertical domain, may be omitted, and a pattern formation process may be simplified and a cost that may be required for processes may be reduced.

Figure 3:
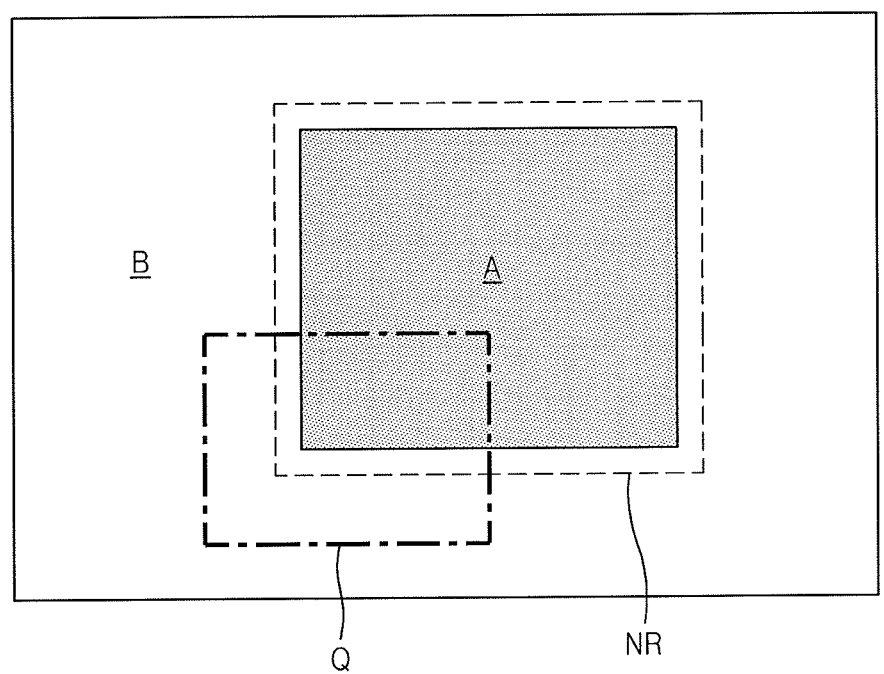
FIG. 3 illustrates a plan view of some elements of an integrated circuit device according to an exemplary embodiment.

FIG. 3 illustrates a plan view of a configuration of an integrated circuit device 200 according to an exemplary embodiment.

Referring to FIG. 3, the integrated circuit device 200 may include a first region A and a second region B, which have different pattern densities. The first region A may be a high-density region having a relatively high pattern density, and the second region B may be a low-density region having a relatively low pattern density. In some exemplary embodiments, the first region A may be a cell array region of a semiconductor memory device. For example, a volatile memory cell array, such as dynamic random access memory (DRAM), or a non-volatile memory cell array, such as a flash memory, may be formed in the first region A. Peripheral circuits electrically connected to cell arrays formed in the first region A may be formed in the second region B. The second region B may include a region in which a cell array may not be formed, like a core region. Hereinafter, the term "peripheral circuit region" means a region in which the peripheral circuits are formed or a core region.

The second region B may include a neighboring region (NR) that surrounds the first region A at a portion adjacent to the first region A.

FIG. 3 illustrates an exemplary embodiment in which the first region A is surrounded by the second region B. In an embodiment, the first region A and the second region B may be appropriately disposed according to need.

Figure 4A:
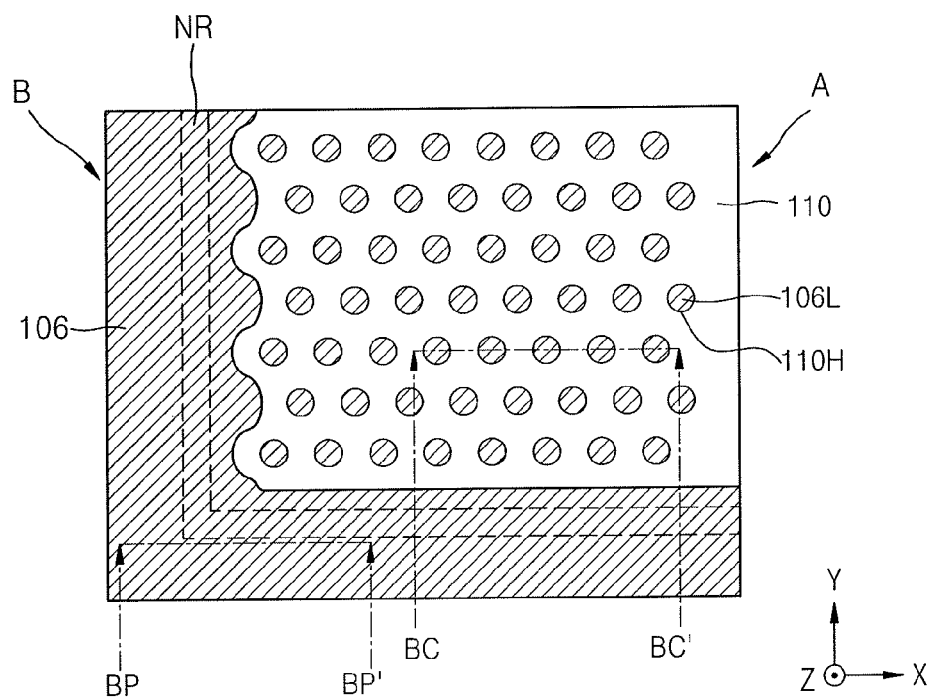
Figure 4B:
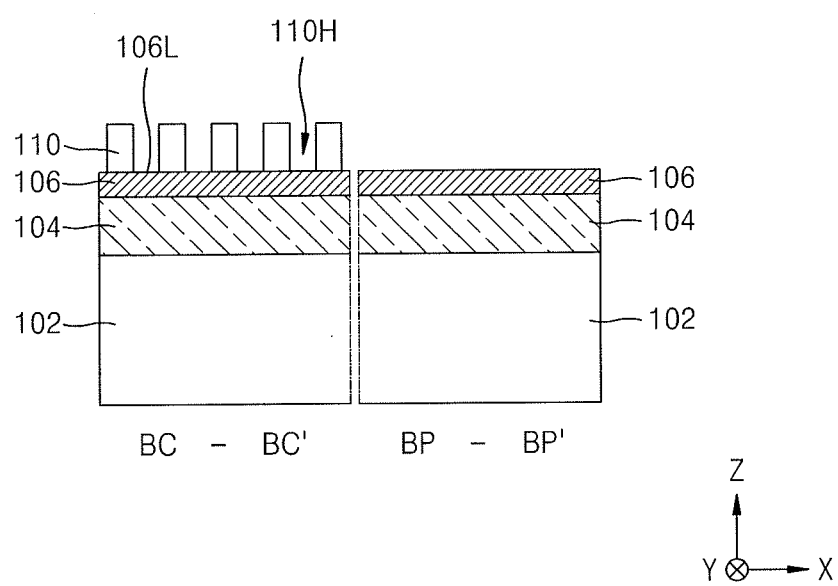
Figure 5A:
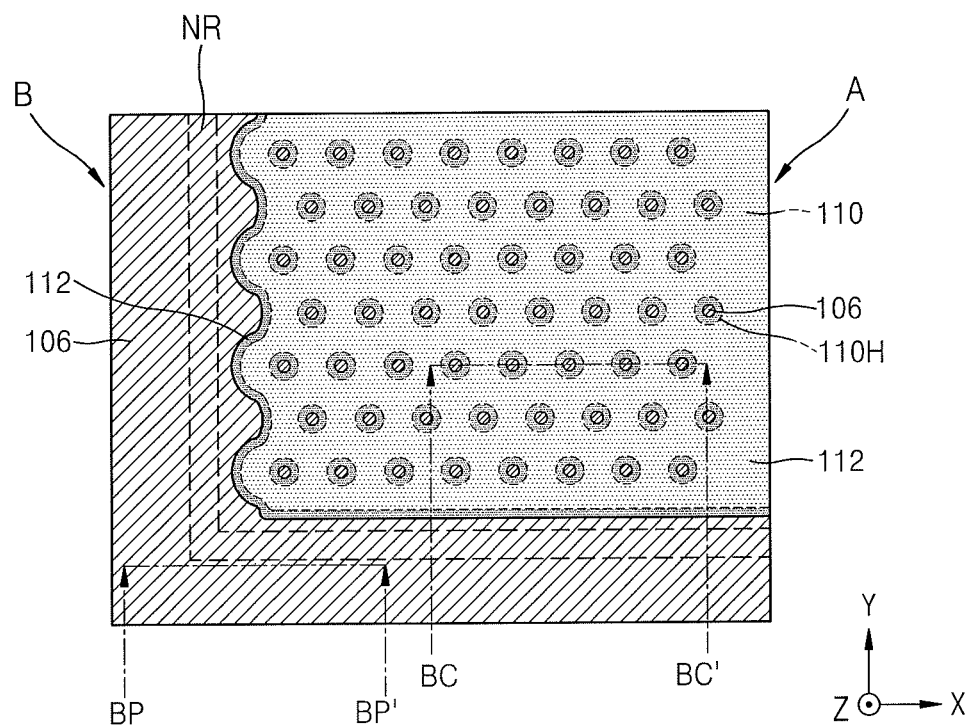
Figure 5B:
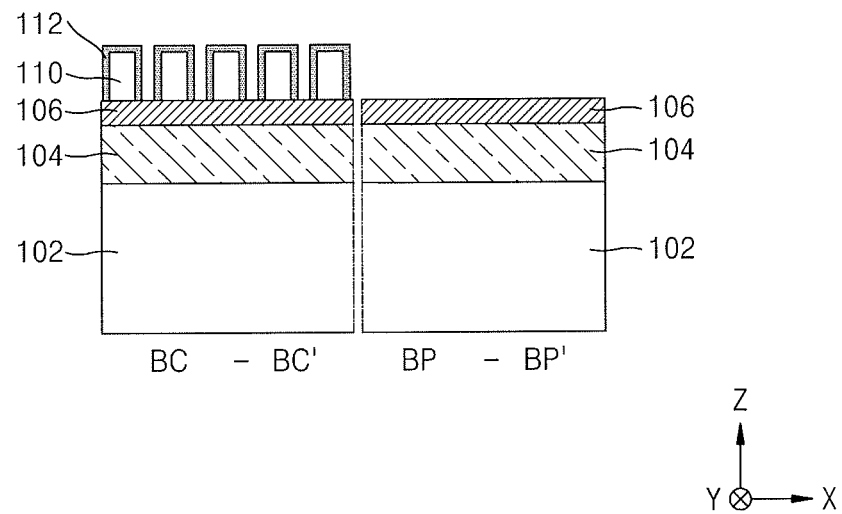

FIGS. 4A and 4B through FIGS. 13A and 13B sequentially illustrate views of a method of manufacturing an integrated circuit device 300 (refer to FIGS. 13A and 13B), according to an exemplary embodiment. FIGS. 4A, 5A, . . . , 13A illustrate plan views of exemplary structures of a part corresponding to a region indicated by a dashed line Q in the integrated circuit device 300 of FIG. 3. FIGS. 4B, 5B, . . . , 13B illustrate cross-sectional views taken along a line BC-BC' and a line BP-BP' of FIGS. 4A, 5A, . . . , 13A. In FIGS. 4A and 4B through FIGS. 13A and 13B, the same elements as those in FIGS. 1A through 2F are denoted by the same reference numerals, and detailed descriptions thereof will not be given.

Referring to FIGS. 4A and 4B, similarly to that described with reference to FIGS. 2A and 2B, a feature layer 104 and a first guide layer 106 are sequentially formed on a substrate 102, and then a mask pattern 110 may be formed on the first guide layer 106 on the first region I. The mask pattern 110 may have a plurality of openings 110H that may expose a plurality of regions 106L of the upper surface of the first guide layer 106.

The plurality of openings 110H formed in the mask pattern 110 may be arranged in a regular shape. In some exemplary embodiments, the plurality of openings 110H may be arranged in a hexagonal array, as shown in FIG. 4A. In some other exemplary embodiments, the plurality of openings 110H may be arranged in a matrix array.

Referring to FIGS. 5A and 5B, similarly to that described with reference to FIG. 2C, a mask spacer layer 112, which may cover an exposed surface including sidewalls of the mask pattern 110, may be formed on the first region I.

In some exemplary embodiments, the mask spacer layer 112 may include a material that is the same as a constituent material of the first guide layer 106. For example, the first guide layer 106 and the mask spacer layer 112 each may be a polymer layer including PS as a main component. A PS solution including PS-OH may be used to form the mask spacer layer 112, and the mask spacer layer 112 may be formed only on an exposed surface of the mask pattern 110 by using hydroxyl of the PS-OH as an anchoring group. The mask spacer layer 112 may be formed by using a method of forming a covalent bond through condensation reaction. The mask spacer layer 112 may not be formed on the first guide pattern 160P. Accordingly, after the mask spacer layer 112 may be formed, the upper surface of the first guide layer 106 may be partially exposed in the first region A. In the second region B, the upper surface of the first guide layer 106 may be completely exposed.

Figure 6A:
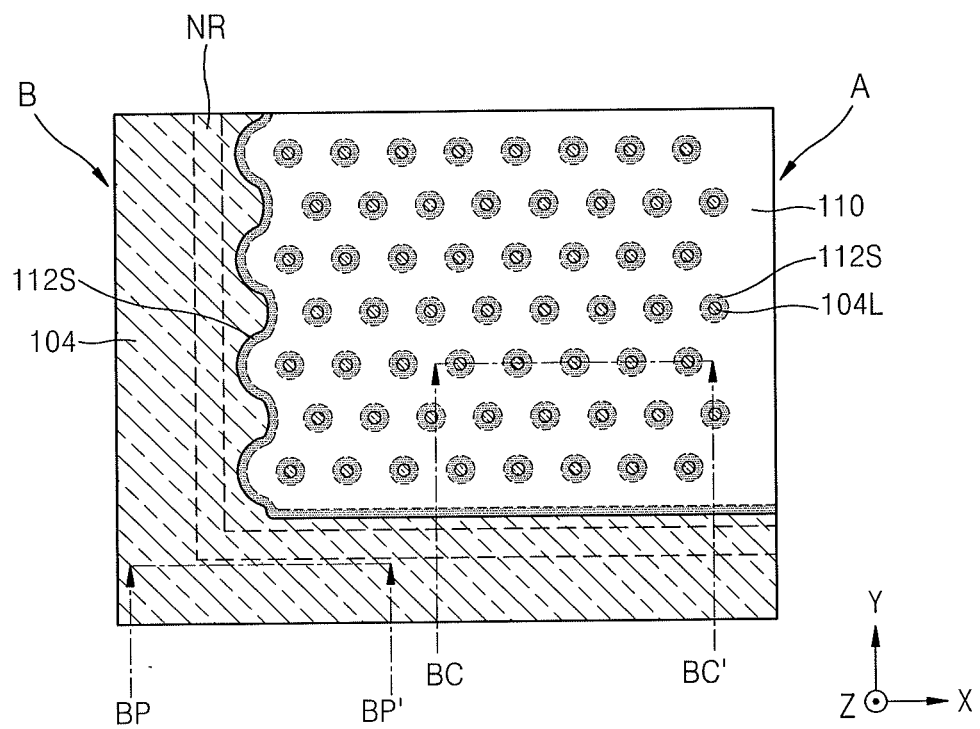
Figure 6B:
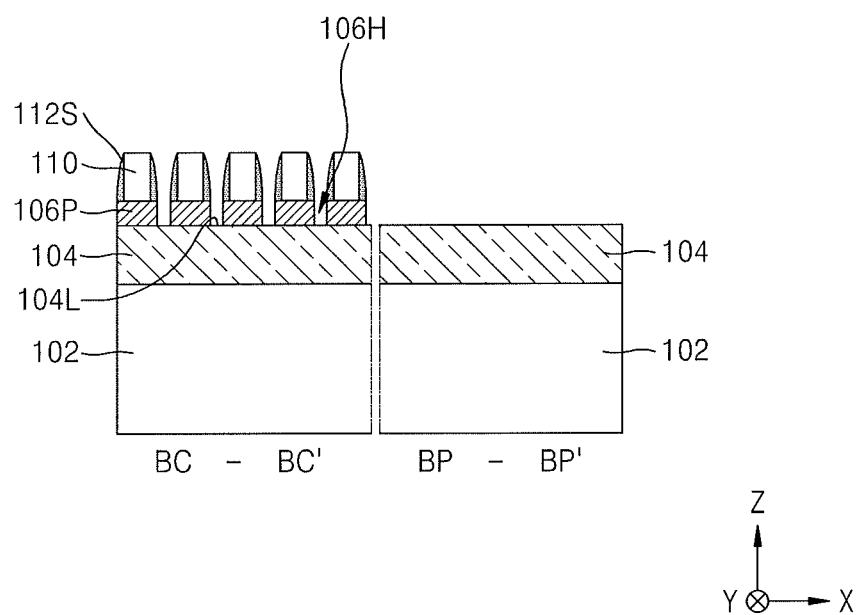

Referring to FIGS. 6A and 6B, similarly to that described with reference to FIG. 2D, an etch-back process may be performed on the mask spacer layer 112, and a plurality of mask spacers 112S may be formed covering the sidewalls of the mask pattern 110. Next, similarly to that described with reference to FIG. 2E, the first guide layer 106 may be etched in the first region I and the second region II by using the mask pattern 110 and the plurality of mask spacers 112S as an etch mask, and a first guide pattern 106P having a plurality of openings 106H formed therein may be formed in the first region A. Thus, in the first region I, the first guide pattern 106P as illustrated in FIG. 1A may be formed, and in the second region II, the first guide layer 106 may be removed to expose the feature layer 104.

In the first region A, a plurality of local regions 104L, spaced apart from each other, of the upper surface of the feature layer 104 may be exposed through the plurality of openings 106H formed in the first guide pattern 106P. In the second region B, the first guide layer 106 may be completely removed, and the feature layer 104 may be exposed.

Figure 7A:
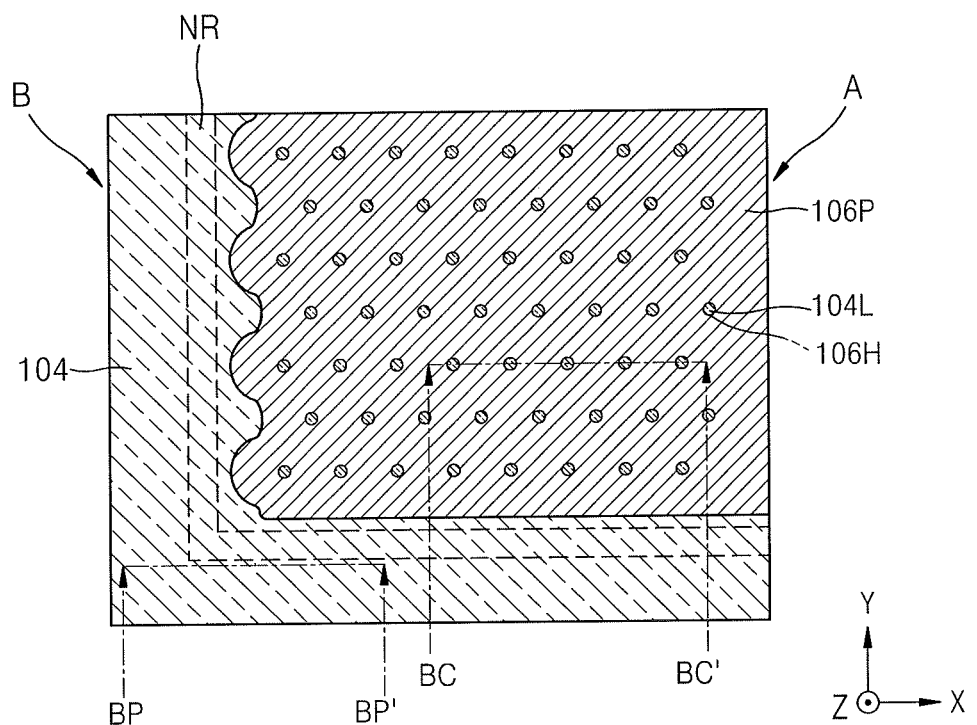
Figure 7B:
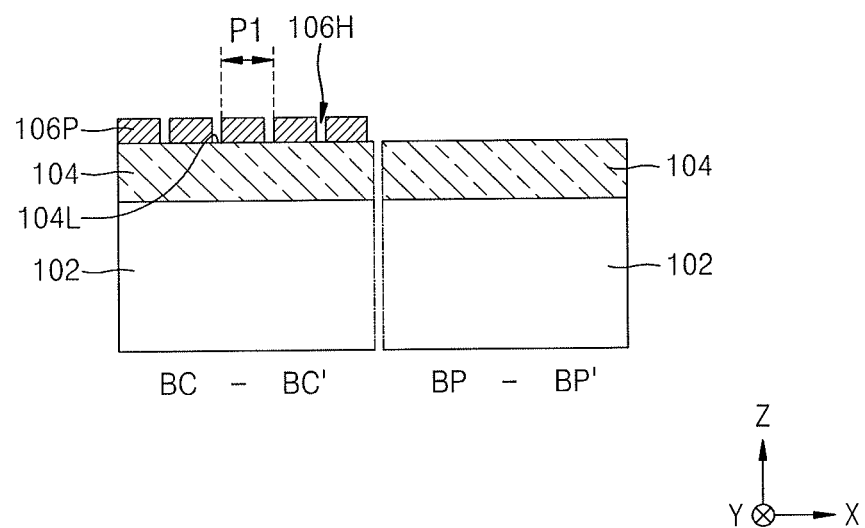

Referring to FIGS. 7A and 7B, unnecessary materials, which may include the mask pattern 110 and the plurality of mask spacers 112S which may remain on the first guide pattern 106P, may be removed to expose the upper surface of the first guide pattern 106P.

The plurality of openings 106H formed in the first guide pattern 106P in the first region A may form a regular arrangement. For example, the plurality of openings 106H formed in the first guide pattern 106P may form a hexagonal array in which the openings 106H are regularly arranged with a first pitch P1.

Figure 8A:
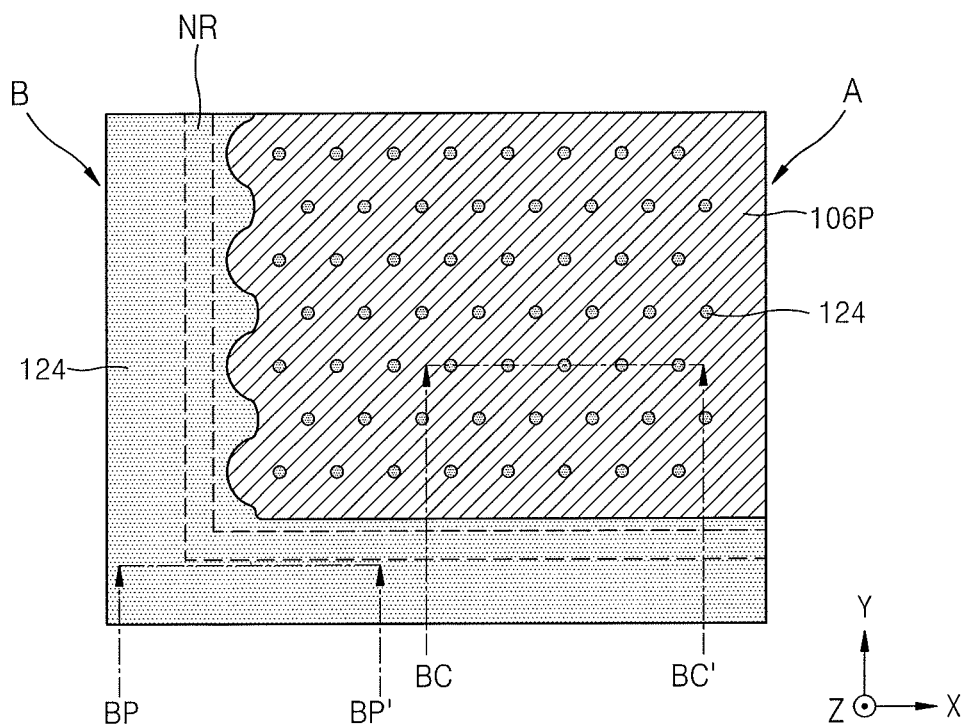
Figure 8B:
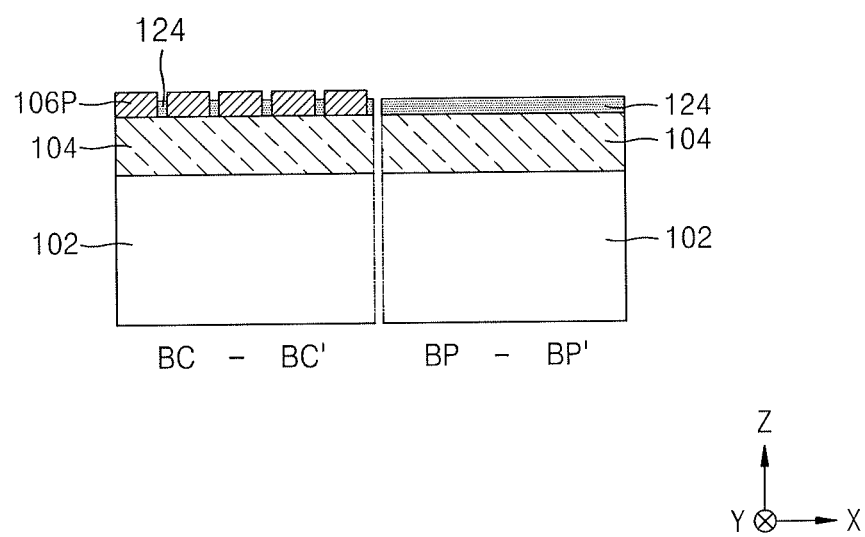

Referring to FIGS. 8A and 8B, similarly to that described with reference to FIG. 1B, a second guide pattern 124, which may cover the feature layer 104 exposed through the first guide pattern 106P, may be formed in the first region I and the second region II.

The second guide pattern 124 may be formed only on a surface of the feature layer 104, which contacts a PMMA solution, by using, as an anchoring group, hydroxyl of PMMA-OH included in the PMMA solution.

Figure 9A:
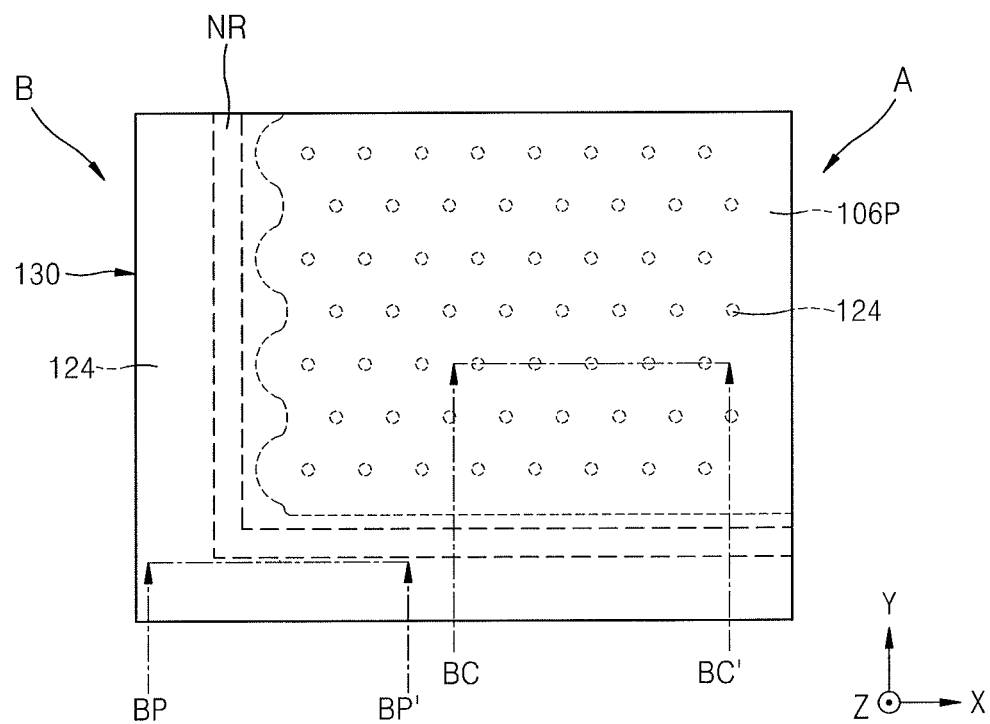
Figure 9B:
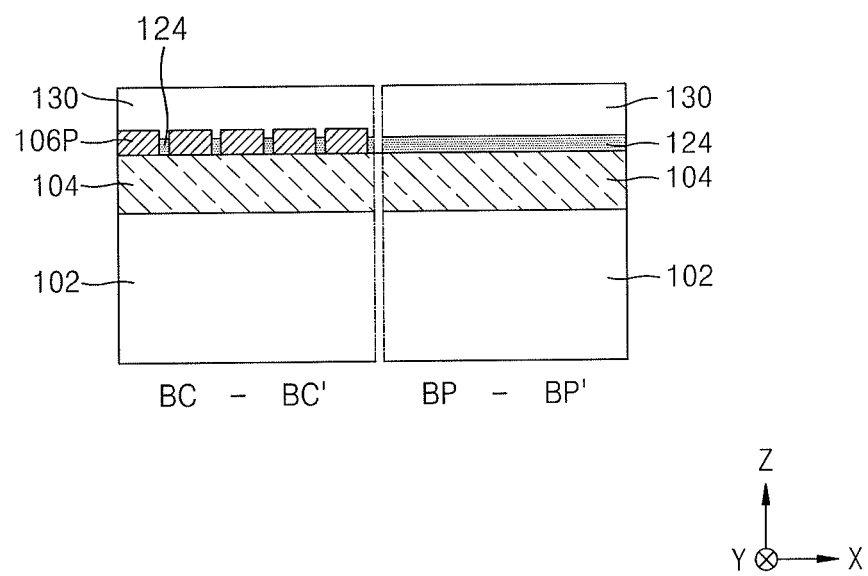

Referring to FIGS. 9A and 9B, similarly to that described with reference to FIG. 1C, a block copolymer layer 130 may be formed on the first guide pattern 106P and the second guide pattern 124 in the first region A and the second region B.

Figure 10A:
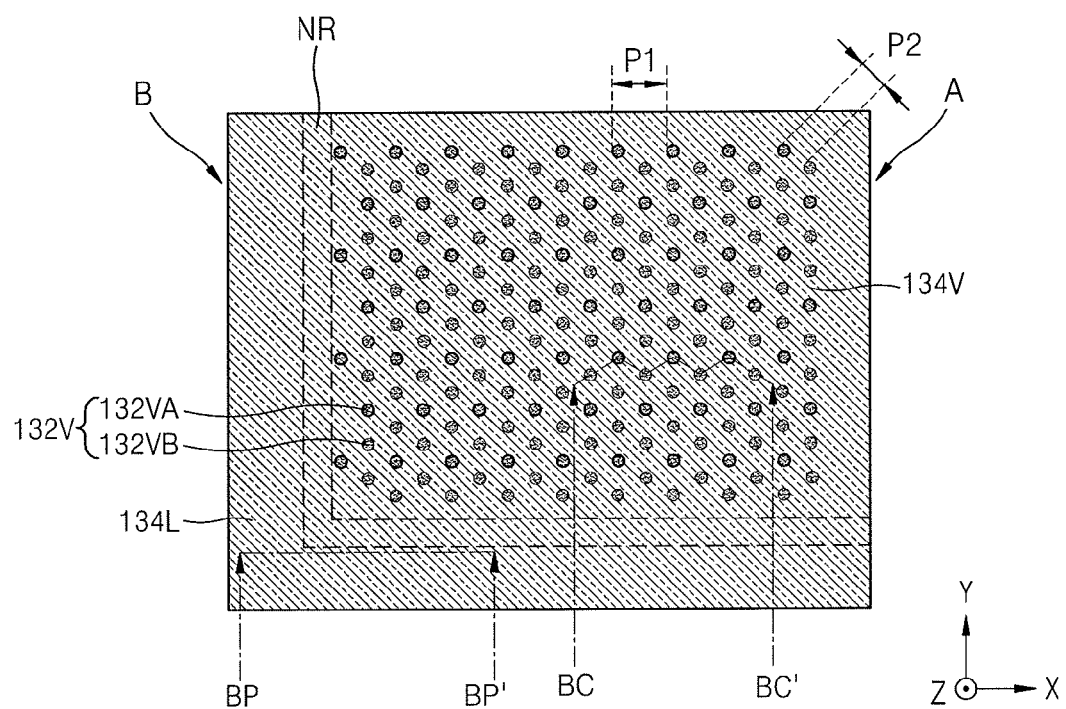
Figure 10B:
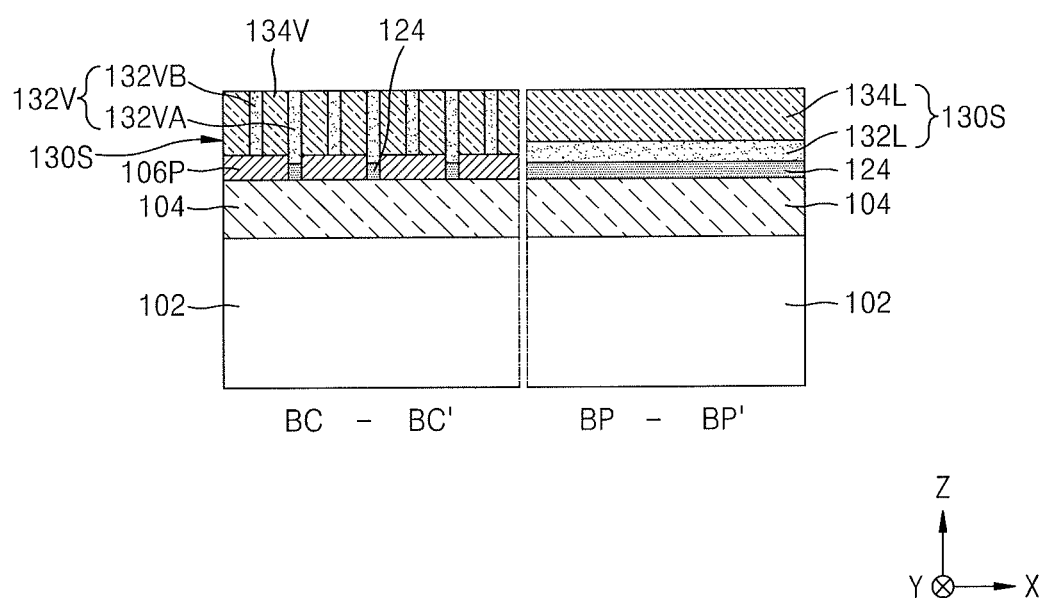

Referring to FIGS. 10A and 10B, similarly to that described with reference to FIG. 1D, the block copolymer layer 130 (refer to FIGS. 9A and 9B) may be phase-separated to form a self-assembled layer 130S that may include a plurality of first domains 132V and 132L and a plurality of second domains 134V and 134L.

The plurality of first domains 132V and 132L of the self-assembled layer 130S may include a first polymer block having a relatively higher affinity for the second guide pattern 124 between the first guide pattern 106P and the second guide pattern 124. The first polymer block may include PMMA, PEO, PLA, or PI.

The plurality of second domains 134V and 132L of the self-assembled layer 130S may include a second polymer block having a relatively higher affinity for the first guide pattern 106P between the first guide pattern 106P and the second guide pattern 124. The second polymer block may include PS.

The plurality of first domains 132V and 132L may include a first vertical domain 132V including vertical domains 132VA and 132VB self-aligned so as to be vertically oriented in the first region I, and a first horizontal domain 132L that may be formed on the second guide pattern 124 in the second region II and may extend in a horizontal direction (a direction parallel to an X-Y plane in FIGS. 10A and 10B) parallel to the substrate 102.

In the first region I, the first vertical domain 132V may include a plurality of vertical domains 132VA and a plurality of vertical domains 132VB. The plurality of vertical domains 132VA may be self-aligned so as to be vertically oriented on the second guide pattern 124 on the plurality of local regions 104L of the feature layer 104, by using the second guide pattern 124 as a guide. The plurality of vertical domains 132VB may be self-aligned so as to be vertically oriented between three vertical domains 132VA that may be formed on the first guide pattern 106P and may be adjacent to each other.

The plurality of vertical domains 132VA, together with the plurality of vertical domains 132VB, may form a regular arrangement. For example, the plurality of vertical domains 132VA may form a hexagonal array in which the vertical domains 132VA are regularly arranged with a first pitch P1, and the plurality of vertical domains 132VB, together with the plurality of vertical domains 132VA, may form a hexagonal array in which the vertical domains 132VB and the vertical domains 132VA are regularly arranged with a second pitch P2 that is less than the first pitch P1.

The plurality of second domains 134V and 134L may include a second vertical domain 134V self-aligned so as to be vertically oriented on the first guide pattern 106P while surrounding the plurality of first vertical domains 132VA and 132VB in the first region I, and a second horizontal domain 134L that may be formed on the first horizontal domain 132L in the second region II and may extend in the horizontal direction (the direction parallel to the X-Y plane in FIGS. 10A and 10B) parallel to the substrate 102.

In the second region II, a layered structure, in which the first horizontal domain 132L and the second horizontal domain 134L may be alternately self-assembled at least one time in a direction away from the substrate 102, may be formed.

In the second region II, a pattern for guiding the first and second polymer blocks obtained as a result of the phase-separation of the block copolymer layer 130 (refer to FIGS. 9A and 9B) may not be formed over a relatively large area, and the first horizontal domain 132L, which may include the first polymer block having a relatively higher affinity for the second guide pattern 124, may be the lowest layer that may be closest to the substrate 102. In the second region II, the second horizontal domain 134L including the second polymer block may be the highest layer of the self-assembled layer 130S, which is most distant, e.g., may be farthest, from the substrate 102.

FIGS. 10A and 10B illustrate an exemplary embodiment in which the self-assembled layer 130S may have a layered structure self-assembled to include one first horizontal domain 132L and one second horizontal domain 134L in the second region II. In an embodiment, the self-assembled layer 130S may have a layered structure in which a plurality of first horizontal domains 132L and a plurality of second horizontal domains 134L are stacked to be alternately self-assembled.

After the self-assembled layer 130S is formed, an unwanted first vertical domain 132VB may be formed in a neighboring region NR of the second region B, which may be adjacent to the first region A, in some cases. According to the integrated circuit device manufacturing method according to the exemplary embodiment, a possibility that an unwanted first vertical domain 132VB is to be formed in the neighboring region NR may be reduced since the second horizontal domain 134L including the second polymer block that may be a major block may be formed as the highest layer of the self-assembled layer 130S, which is most distant, e.g., may be farthest, from the substrate 102 in the second region B. Accordingly, an effective area that may be necessary for forming a device on the substrate 102 may be effectively used, and a trimming process for removing an unnecessary pattern that may be incidentally formed due to, for example, an unnecessarily formed vertical domain, may be omitted, and an integrated circuit device manufacturing process may be simplified.

Figure 11A:
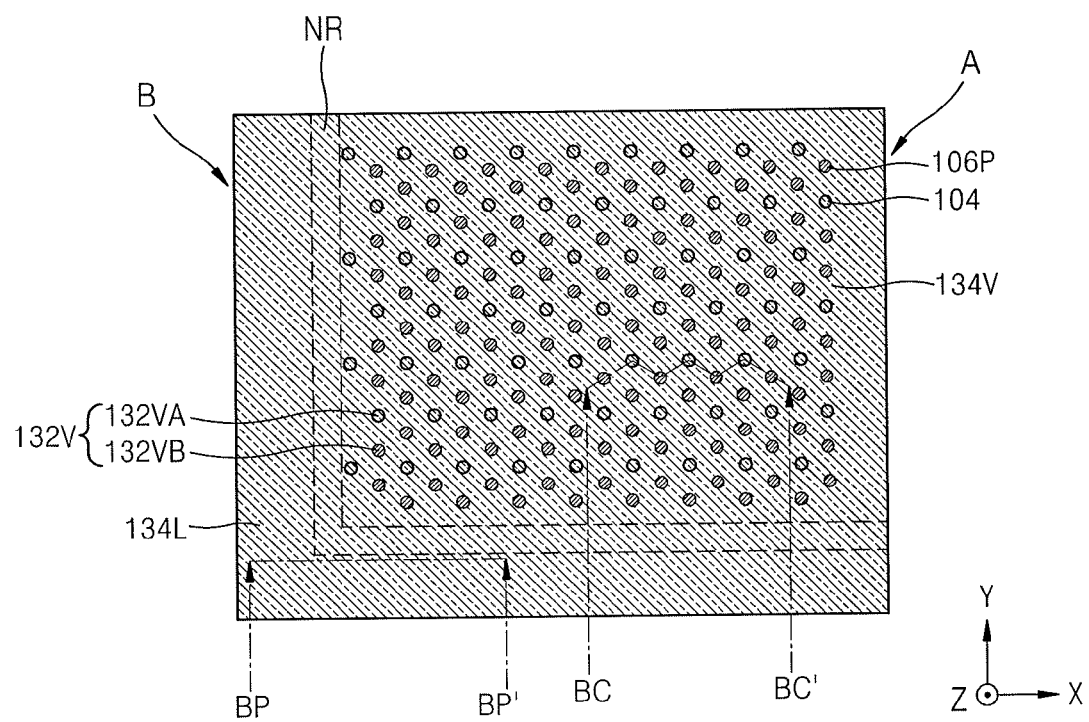
Figure 11B:
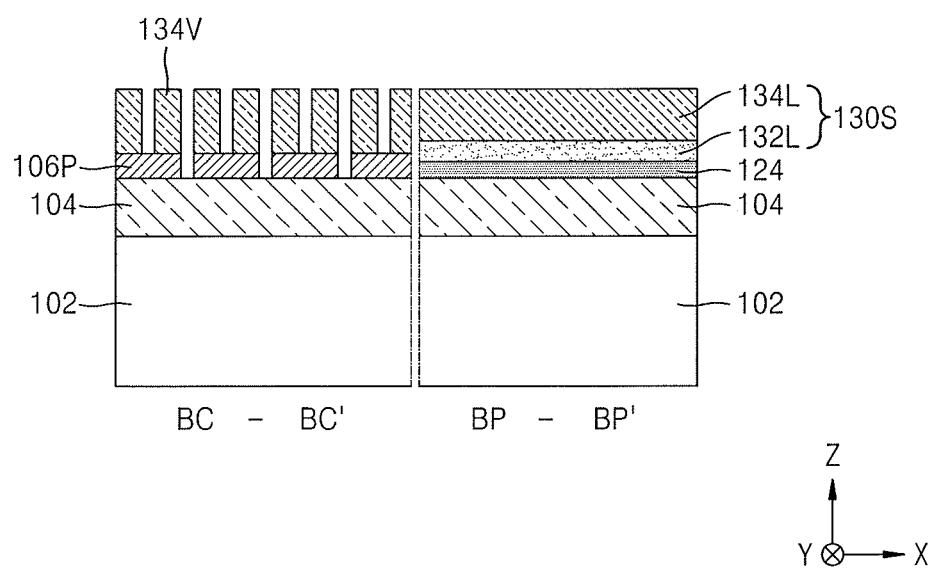

Referring to FIGS. 11A and 11B, similarly to that described with reference to FIG. 1E, the plurality of first vertical domains 132V of the self-assembled layer 130S may be removed in the first region A.

Figure 12A:
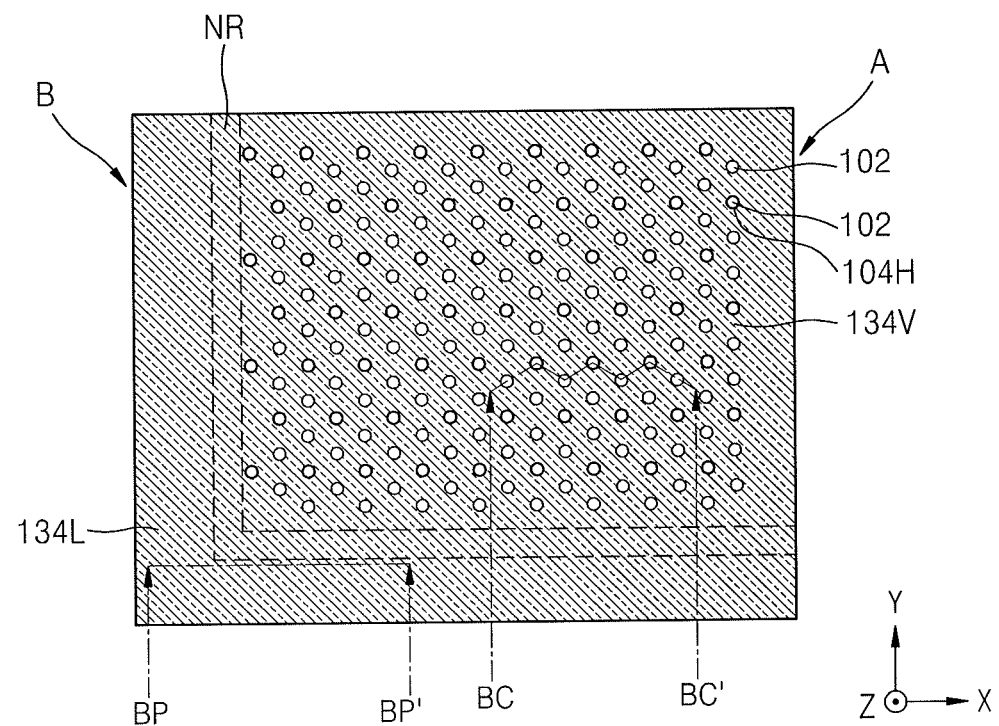
Figure 12B:
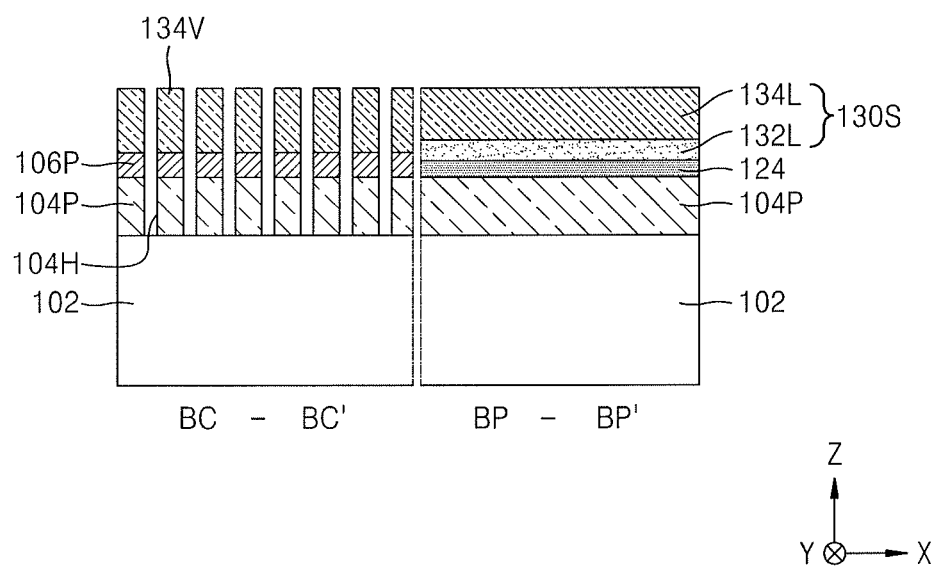

Referring to FIGS. 12A and 12B, similarly to that described with reference to FIG. 1F, the first guide pattern 106P and the feature layer 104 are etched by using the second vertical domain 134V in the first region I and the second horizontal domain 134L in the second region II as an etch mask, and a feature pattern 104P having a plurality of holes 104H formed therein may be formed.

Figure 13A:
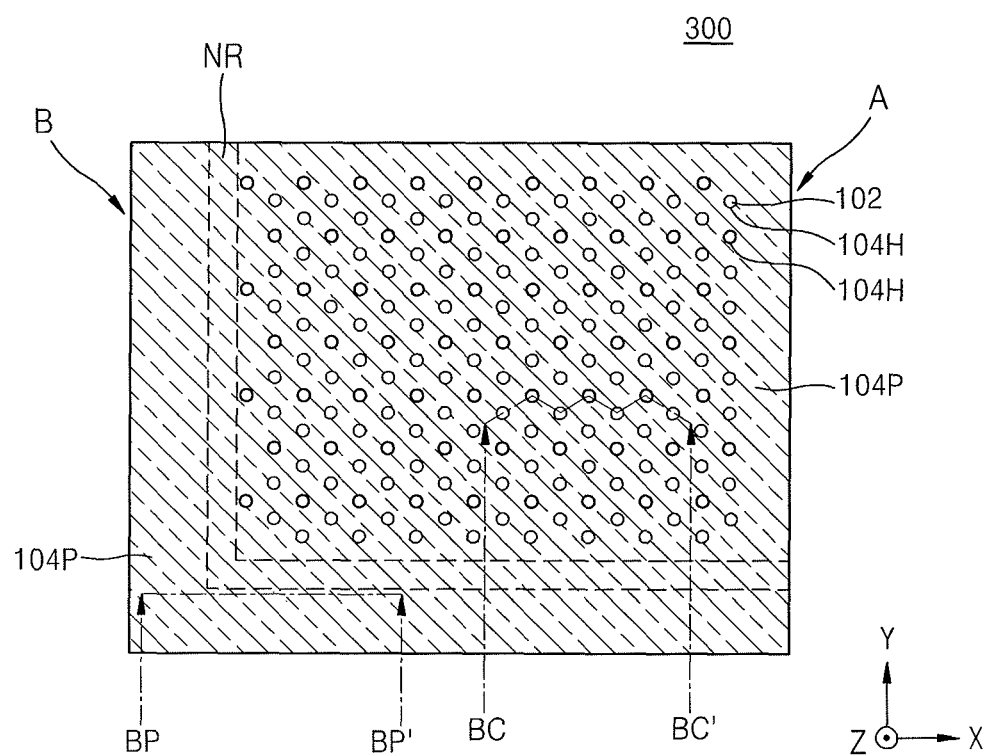
Figure 13B:
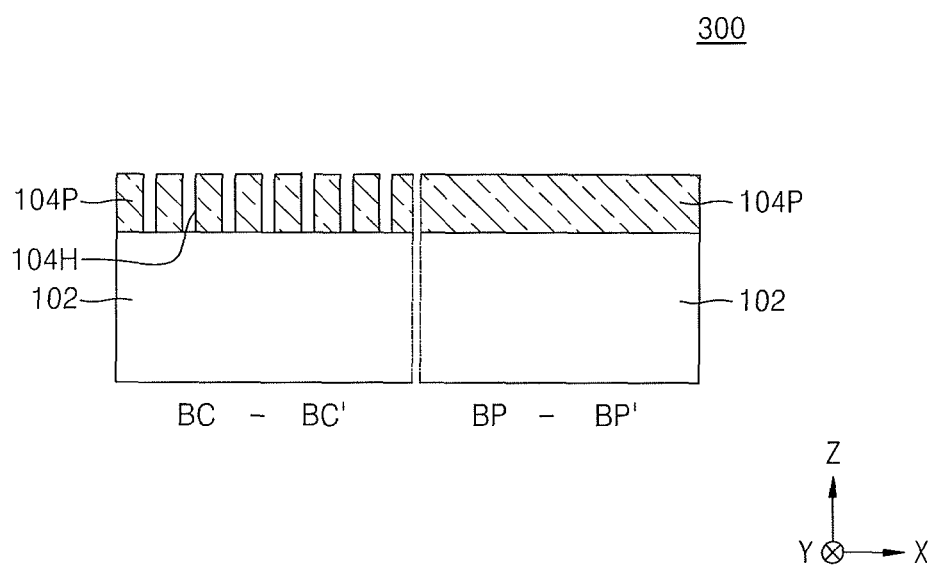

Referring to FIGS. 13A and 13B, similarly to that described with reference to FIG. 1G, unnecessary layers remaining on the feature pattern 104P may be removed to expose the upper surface of the feature pattern 104P.

According to the integrated circuit device manufacturing method described with reference to FIGS. 4A through 13B, the plurality of first vertical domains 132V, which are vertically oriented by using the second guide pattern 124 during the phase-separation of the block copolymer layer 130, and the second vertical domain 134V, which may surround the plurality of first vertical domains 132V, may be formed in the first region A, in which pattern density may be relatively high. In the second region B, in which pattern density may be relatively low, the first horizontal domain 132L and the second horizontal domain 134L may be alternately self-assembled in a layered structure form in a direction away from the substrate 102 during the phase-separation of the block copolymer layer 130. For example, a possibility that an unwanted first vertical domain 132VB is to be formed in the neighboring region NR of the second region B which may be close to the first region A may be reduced since the second horizontal domain 134L including the second polymer block that may be a major block may be formed as the highest layer of the self-assembled layer 130S, which is most distant, e.g., may be farthest, from the substrate 102 in the second region B. Accordingly, an effective area that may be necessary for forming a device on the substrate 102 may be effectively used, and a trimming process for removing an unnecessary pattern that may be incidentally formed due to, for example, an unnecessarily formed vertical domain, may be omitted, and an integrated circuit device manufacturing process may be simplified.

Figure 14:
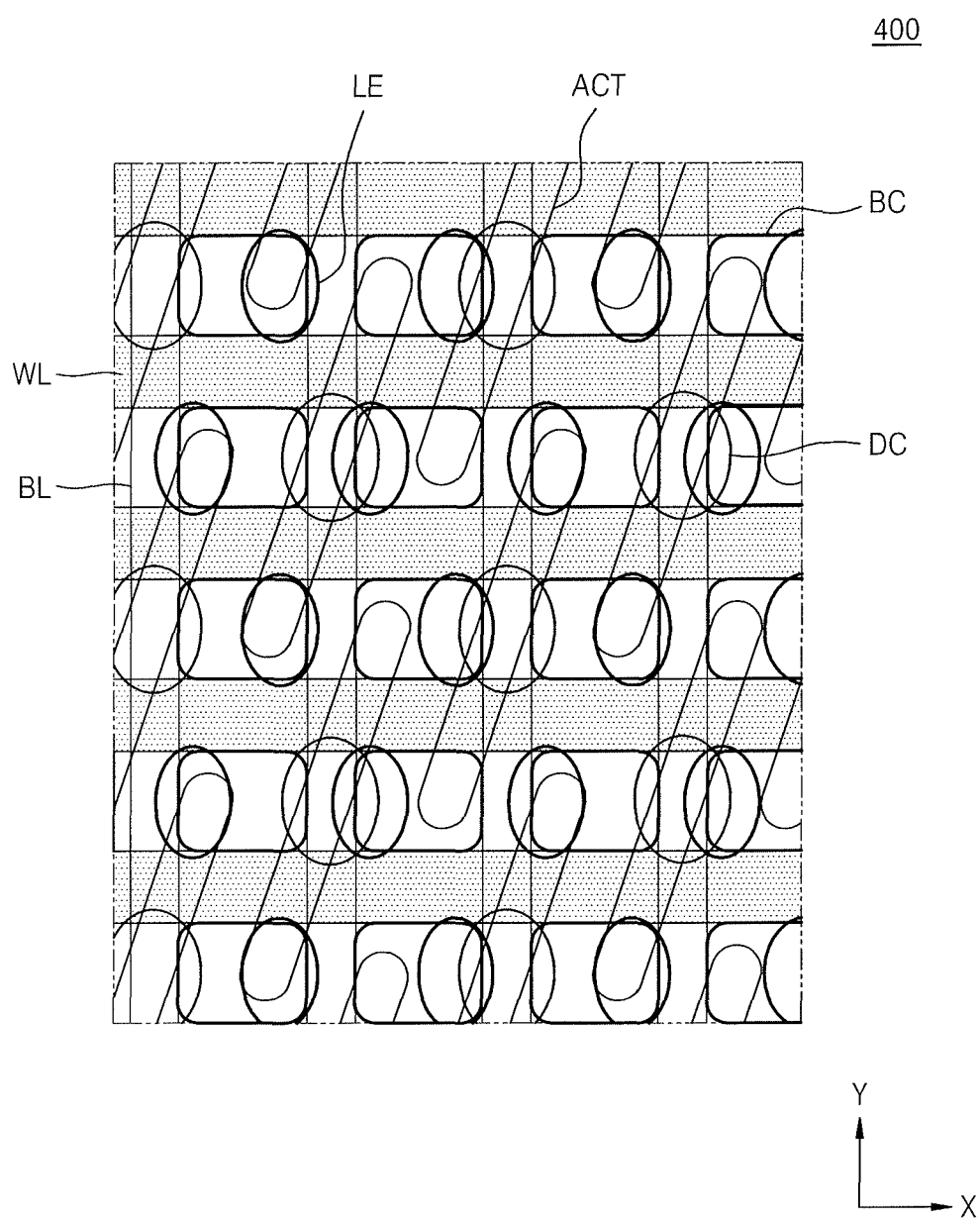
FIG. 14 illustrates a plan layout of main elements of a cell array region of an integrated circuit device that may be implemented by using an integrated circuit device manufacturing method according to an exemplary embodiment.

FIG. 14 illustrates a plan layout of main elements of a cell array region of an integrated circuit device 400 that may be implemented by using the integrated circuit device manufacturing method according to the exemplary embodiment.

Referring to FIG. 14, the integrated circuit device 400 may include a plurality of active regions ACT. The plurality of active regions ACT may be arranged in a diagonal direction with respect to a first direction (X direction) and a second direction (Y direction).

A plurality of word lines WL may extend parallel to one another in the first direction across the plurality of active regions ACT. A plurality of bit lines BL may extend parallel to one another on the plurality of word lines WL in the second direction that is perpendicular to the first direction.

The plurality of bit lines BL may be connected to the plurality of active regions ACT via a plurality of direct contacts DC.

In some exemplary embodiments, a plurality of buried contacts BC may be formed between adjacent two adjacent bit lines BL of the plurality of bit lines BL. Each of the plurality of buried contacts BC may extend up to an upper portion of any one of the two adjacent bit lines BL. In some exemplary embodiments, the plurality of buried contacts BC may be arranged in a line in the first direction and the second direction.

A plurality of lower electrodes LE may be formed on the plurality of buried contacts BC. The plurality of lower electrodes LE may be connected to the active regions ACT via the plurality of buried contacts BC.

FIGS. 15A through 15H sequentially illustrate cross-sectional views of a method of forming the plurality of lower electrodes LE of the integrated circuit device 400 shown in FIG. 14, according to the integrated circuit device manufacturing method according to the exemplary embodiment. In FIGS. 15A through 15H, the same elements as those in FIGS. 1A through 13B are denoted by the same reference numerals, and detailed descriptions thereof will not be given.

Figure 15A:
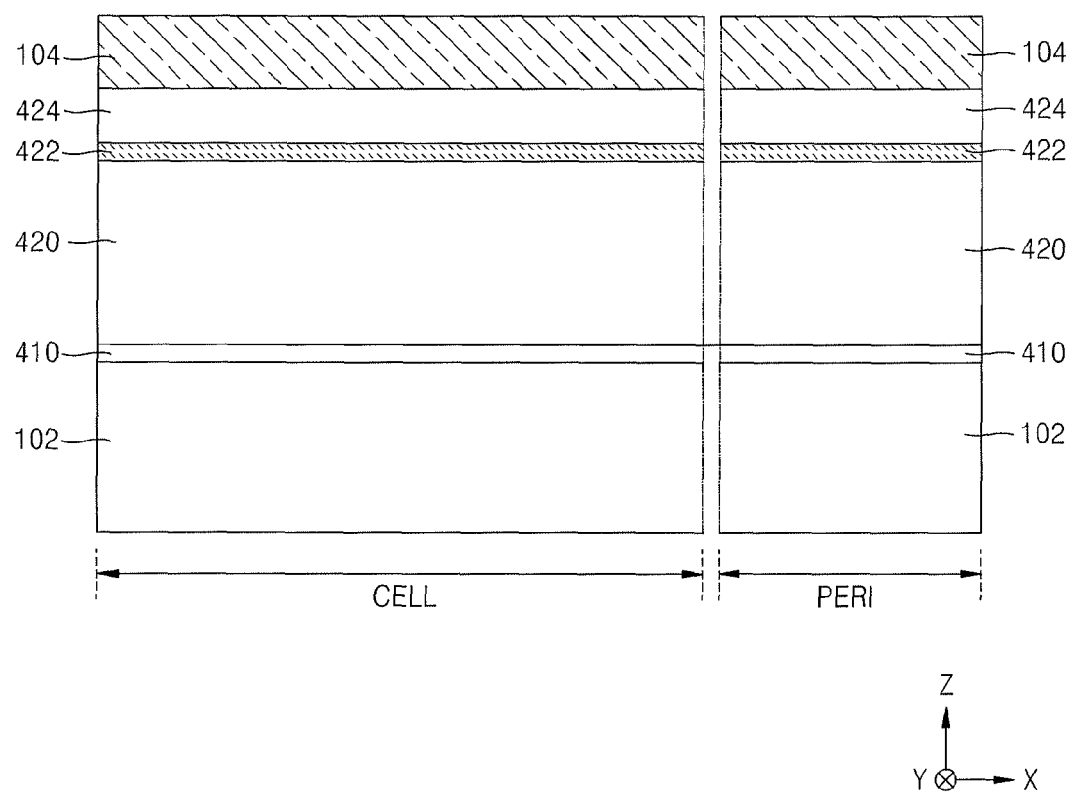
FIGS. 15A through 15H sequentially illustrate cross-sectional views of a method of forming a plurality of lower electrodes, according to an integrated circuit device manufacturing method according to an exemplary embodiment.

Referring to FIG. 15A, an etch stop layer 410, a mold layer 420, a supporting layer 422, and a sacrificial layer 424 are sequentially formed on a substrate 102 including a cell array region CELL and a peripheral circuit region PERI, and a feature layer 104 may be formed on the sacrificial layer 424.

In the cell array region CELL, a plurality of active regions ACT (refer to FIG. 14) and a plurality of conductive regions may be formed in the substrate 102.

In some exemplary embodiments, the etch stop layer 410 may include silicon nitride, silicon oxynitride, or a combination thereof. The mold layer 420 may include silicon oxide. The supporting layer 422 may include silicon nitride, silicon carbonitride, tantalum oxide, titanium oxide, or a combination thereof. The sacrificial layer 424 may include borophosphosilicate glass (BPSG), phosphosilicate glass (PSG), undoped silicate glass (USG), spin on dielectric (SOD), or an oxide film such as a high density plasma (HDP) oxide film. However, the above-stated constituent materials of the layers 410, 420, 422, and 424 are only examples. In the current embodiment, although one supporting layer 422 is disposed on the mold layer 420, at least one supporting layer may be further disposed between the mold layer 420 and the supporting layer 422.

The feature layer 104 may include at least one layer that may be used as an etch mask for patterning the etch stop layer 410, the mold layer 420, the supporting layer 422, and the sacrificial layer 424. For example, the feature layer 104 may include a polysilicon film, a silicon oxide film, a SiCN film, a carbon-containing film including a spin-on hardmask (SOH) material, or a combination thereof. The carbon-containing film including the SOH material may include an organic compound having a relatively high carbon content of about 85 wt % to about 99 wt % based on the total weight thereof. The organic compound may include a hydrocarbon compound including an aromatic ring, such as phenyl, benzene, or naphthalene, or a derivative of the hydrocarbon compound.

Figure 15B:
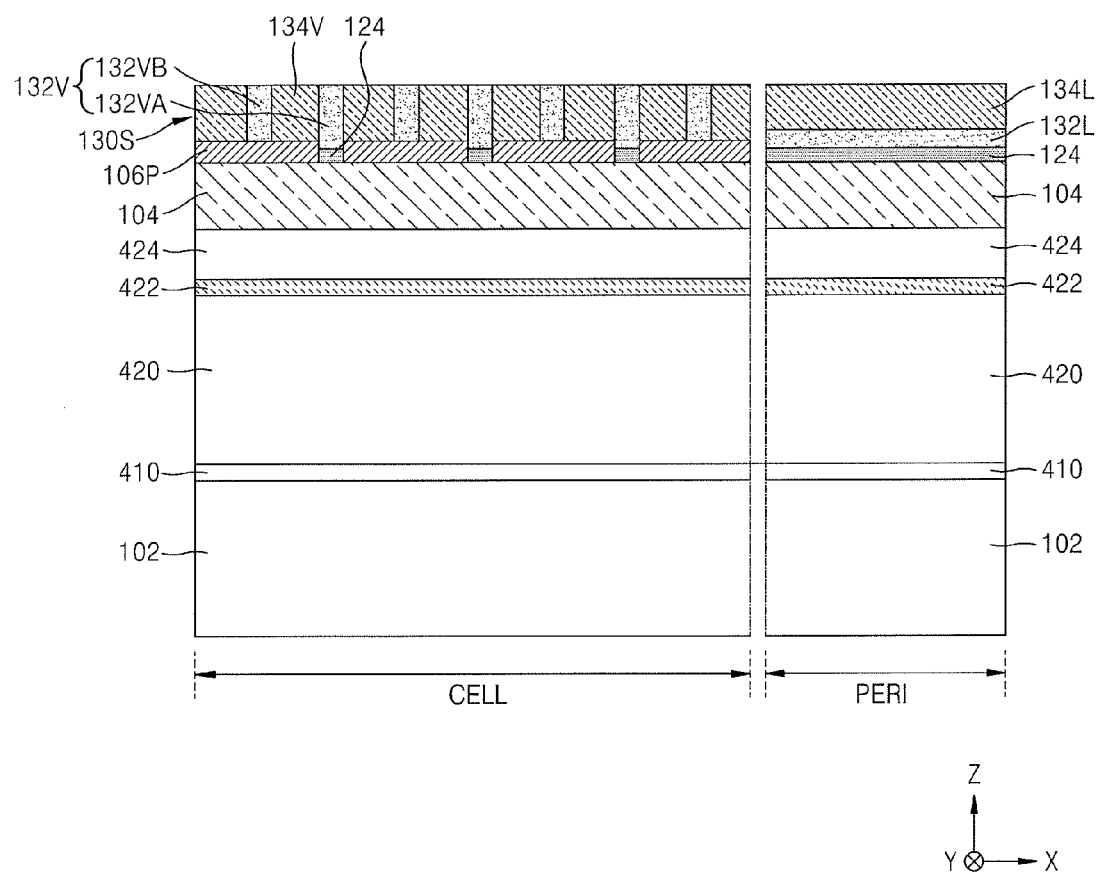

Referring to FIG. 15B, by performing processes described with reference to FIGS. 4A through 10B, a first guide pattern 106P, a second guide pattern 124, and a self-assembled layer 130S self-assembled on the first guide pattern 106P and the second guide pattern 124 may be formed on the feature layer 104 in the cell array region CELL and the peripheral circuit region PERI.

The self-assembled layer 130S may include a first vertical domain 132V and a second vertical domain 134V, self-aligned to be vertically oriented in the cell array region CELL, and may include a first horizontal domain 132L and a second horizontal domain 134L which may extend in a horizontal direction (a direction parallel to an X-Y plane in FIG. 15B) parallel to the substrate 102 in the peripheral circuit region PERI.

Figure 15C:
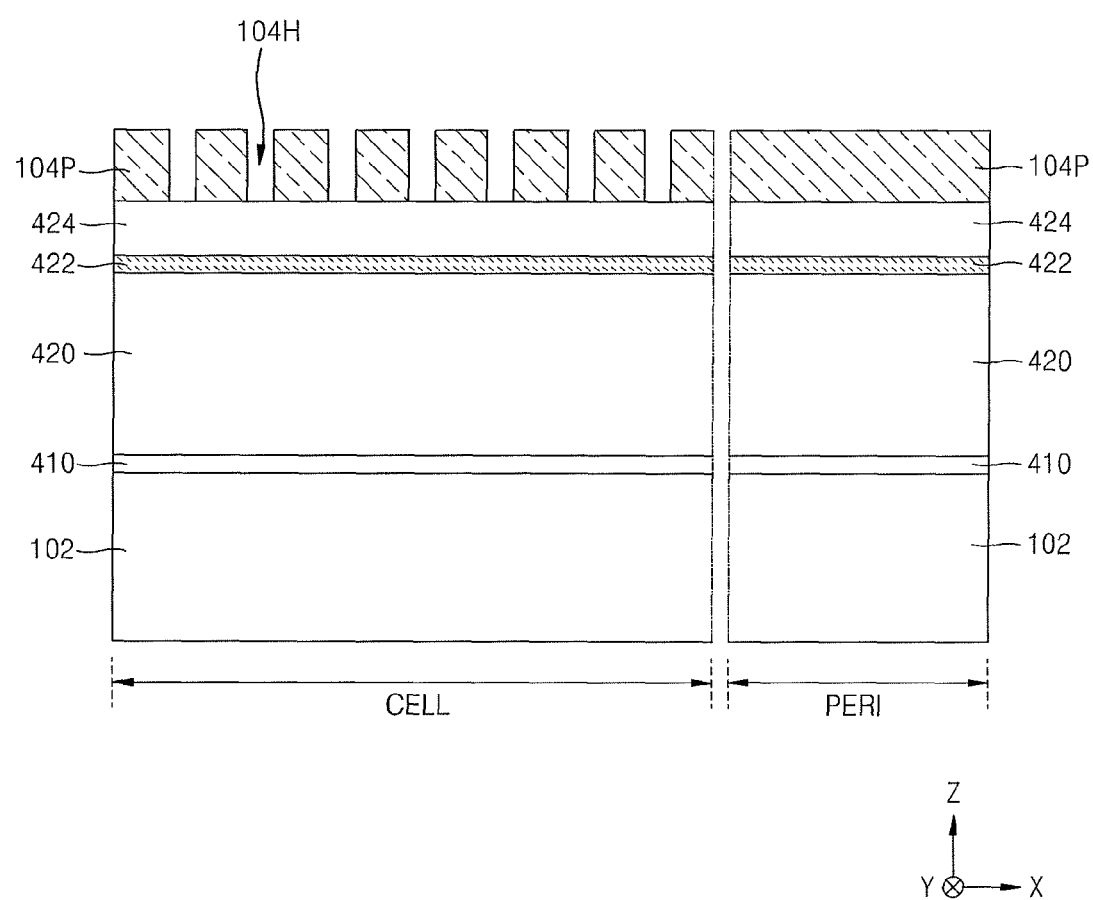

Referring to FIG. 15C, similarly to that described with reference to FIGS. 11A through 13B, a plurality of first vertical domains 132V of the self-assembled layer 130S may be removed from the cell array region CELL of the resultant structure of FIG. 15B, and a feature pattern 104P having a plurality of holes 104H formed therein may be formed by etching the first guide pattern 106P and the feature layer 104 by using the second vertical domain 134V in the cell array region CELL and the second horizontal domain 134L in the peripheral circuit region PERI as an etch mask, and then unnecessary films remaining on the feature pattern 104P may be removed.

Figure 15D:
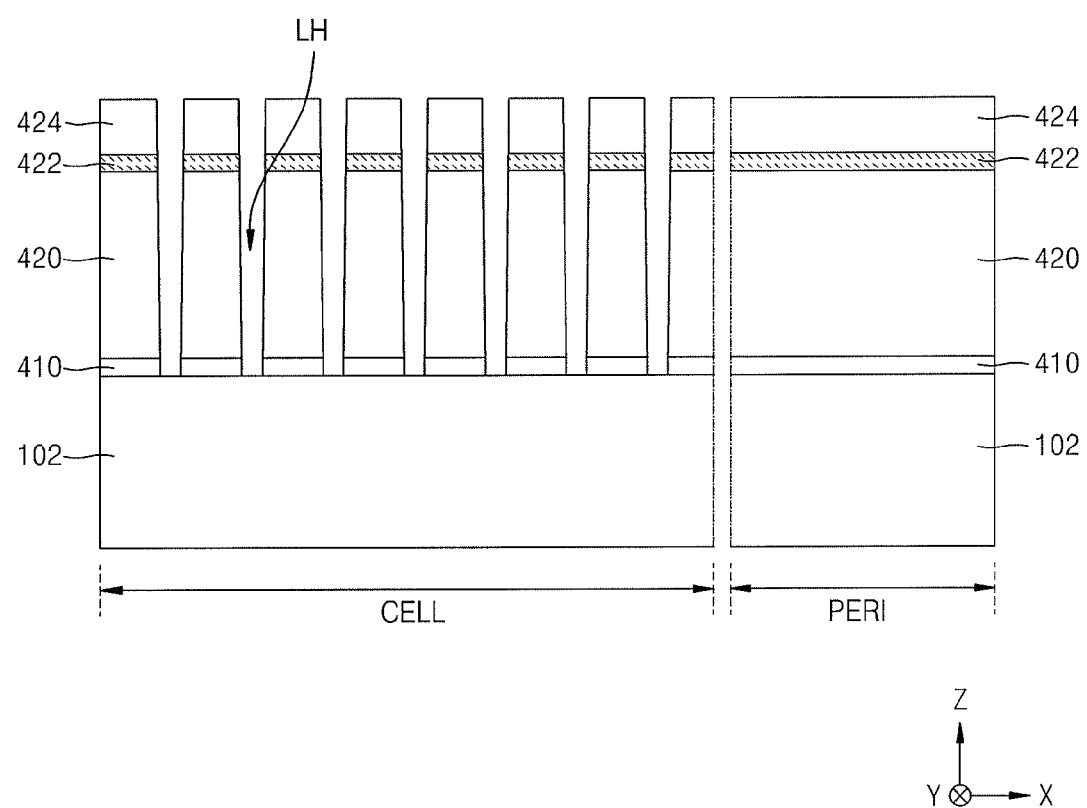

Referring to FIG. 15D, the sacrificial layer 424, the supporting layer 422, and the mold layer 420 are sequentially etched by using the feature pattern 104P as an etch mask and using the etch stop layer 410 as an etching end point, and are continuously etched up to the etch stop layer 410 through an excessive etching, and a plurality of lower electrode holes LH that may expose a plurality of conductive regions region formed in the substrate 104 may be formed.

After the plurality of lower electrode holes LH are formed, the feature pattern 104P may be consumed or removed in the cell array region CELL and the peripheral circuit region PERI, and the upper surface of the sacrificial layer 424 may be exposed.

Figure 15E:
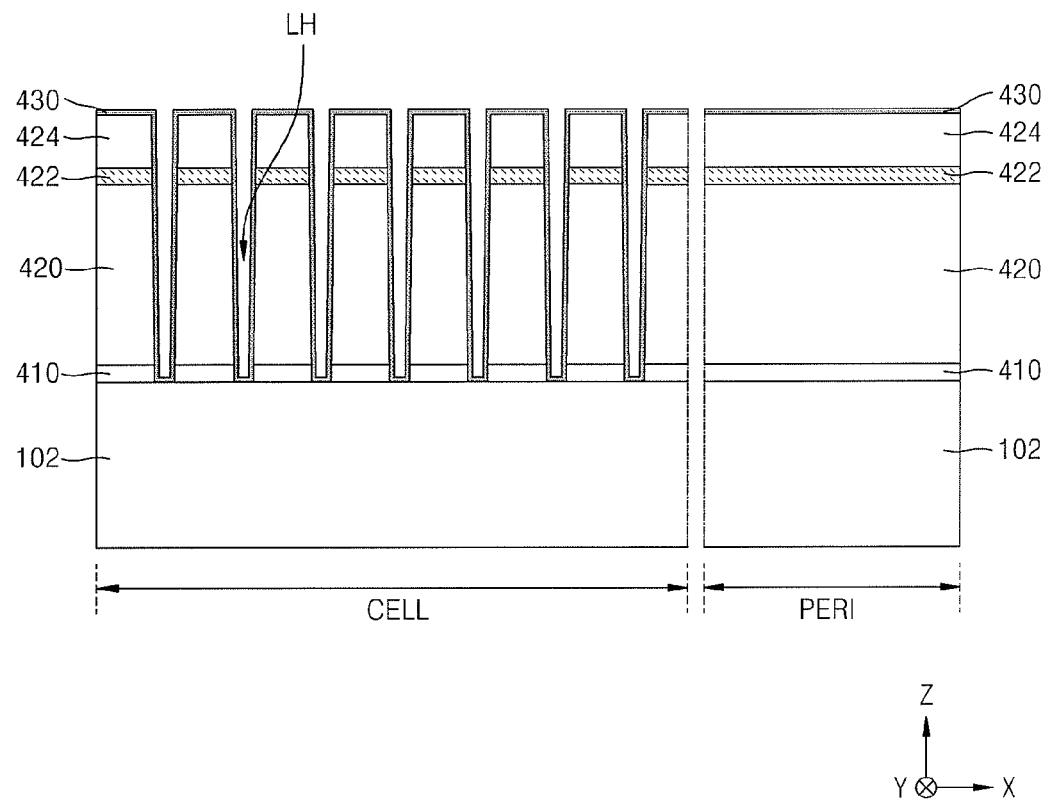

Referring to FIG. 15E, a conductive film 430 for lower electrode formation may be formed to cover surfaces, exposed in the insides of the lower electrode holes LH, and the supper surface of the sacrificial layer 424.

The conductive film 430 for lower electrode formation may conformally cover the surfaces exposed in the insides of the lower electrode holes LH.

In some exemplary embodiments, the conductive film 430 for lower electrode formation may include doped semiconductor, conductive metal nitride, metal, metal silicide, conductive oxide, or a combination thereof. For example, the conductive film 430 for lower electrode formation may include TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

A chemical vapor deposition (CVD) process, a metal organic CVD (MOCVD) process, or an atomic layer deposition (ALD) process may be used to form the conductive film 430 for lower electrode formation.

Figure 15F:
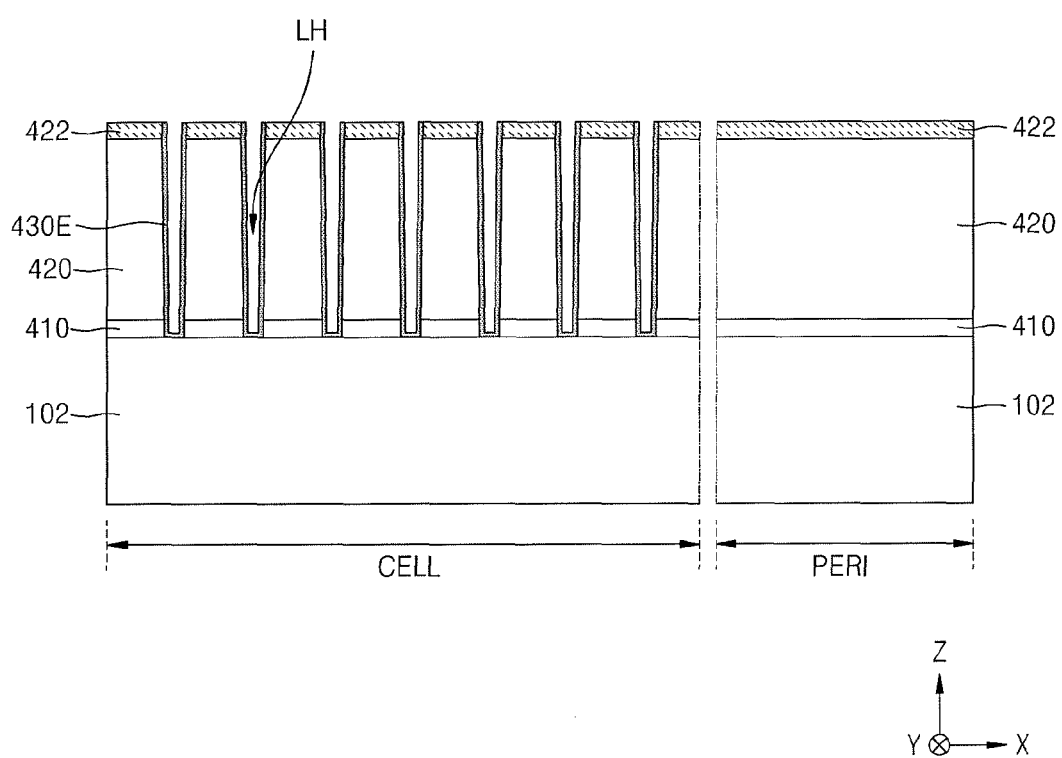

Referring to FIG. 15F, an upper portion of the conductive film 430 for lower electrode formation is partially removed to divide the conductive film 430 into a plurality of lower electrodes 430E.

In order to form the plurality of lower electrodes 430E, an upper portion of the conductive film 430 for lower electrode formation and the sacrificial layer 424 (refer to FIG. 15E) may be removed by using an etch-back process or a chemical mechanical polishing (CMP) process until the upper surface of the supporting layer 422 is exposed.

The plurality of lower electrodes 430E may form the plurality of lower electrodes LE of the integrated circuit device 400 shown in FIG. 14.

In the current embodiment, each of the plurality of lower electrodes 430E may have a cylinder shape. In an embodiment, the plurality of lower electrode holes LH may be filled with the conductive film 430 for lower electrode formation, and an internal space of each of the plurality of lower electrode holes LH may not remain during the process of forming the conductive film 430 for lower electrode formation, described with reference to FIG. 15E. After the conductive film 430 for lower electrode formation is divided into the plurality of lower electrodes 430E, as described with reference to FIG. 15F, the plurality of lower electrodes 430E, each having a pillar shape may be obtained.

Figure 15G:
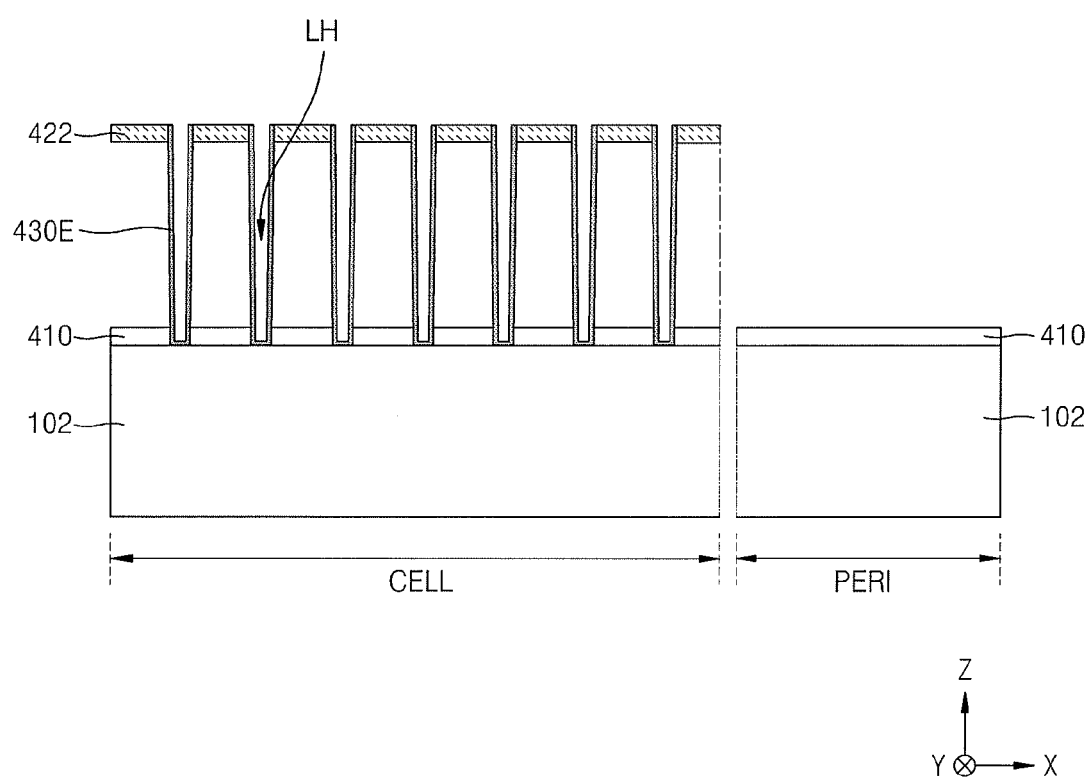

Referring to FIG. 15G, the mold layer 420 (refer to FIG. 15F) may be removed to expose outer wall surfaces of the plurality of lower electrode electrodes 430E in the cell array region CELL.

A wet etching process may be used to remove the mold layer 420. For example, the mold layer 420 may be removed by a lift-off process using limulus amebocyte lysate (LAL) or hydrofluoric acid.

After the mold layer 420 is removed, the plurality of lower electrodes 430E in the cell array region CELL may be supported by the supporting layer 422. On the other hand, in the peripheral circuit region PERI, the supporting layer 422 may be removed together with the mold layer 420.

Figure 15H:
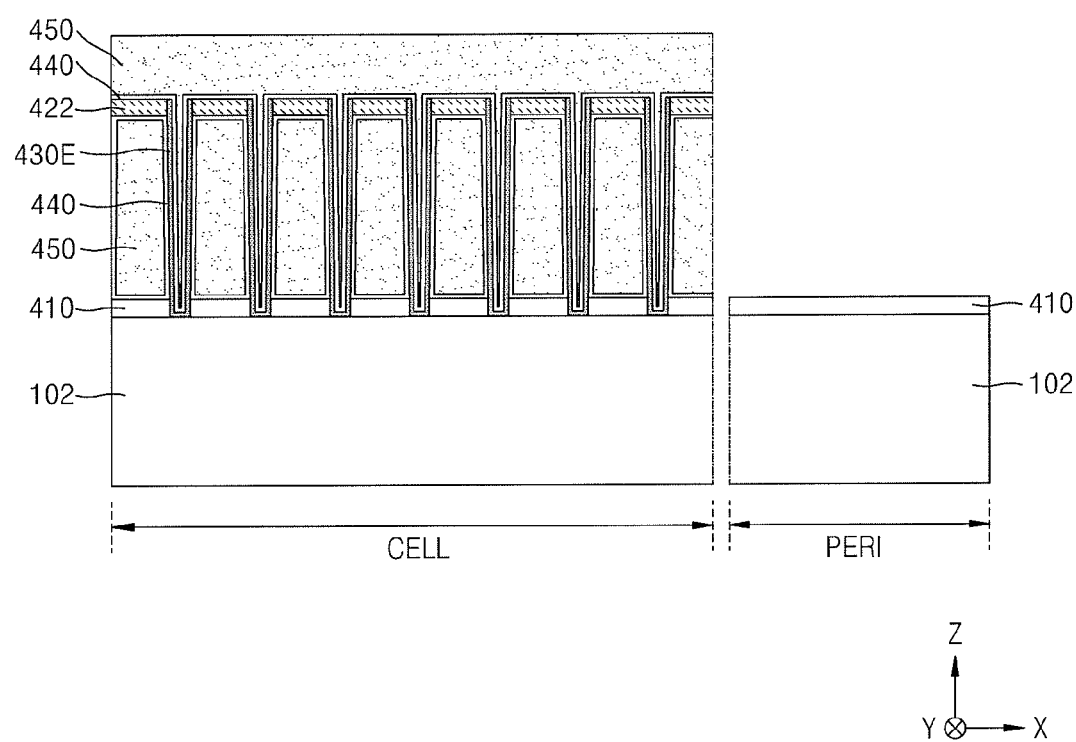

Referring to FIG. 15H, a dielectric film 440 may be formed on the plurality of lower electrodes 430E in the cell array region CELL, and an upper electrode 450 may be formed on the dielectric film 440.

The dielectric film 440 may conformally cover some areas of inner wall surfaces and outer wall surfaces of the plurality of lower electrodes 430E, the surface of the supporting layer 422, and the surface of the etch stop layer 410.

The dielectric film 440 may include nitride, oxide, metal oxide, or a combination thereof. For example, the dielectric film 440 may have a single layer or multi-layer structure including silicon nitride, silicon oxide, metal oxide, such as $HfO_2$, $ZrO_2$, $Al_2O_3$, $La_2O_3$, $Ta_2O_3$, or $TiO_2$, a perovskite-structured dielectric material, such as STO ($SrTiO_3$), BST (($Ba,Sr$)$TiO_3$), $BaTiO_3$, PZT, or PLZT, or a combination thereof. The dielectric film 440 may be formed by using a CVD, PVD, or ALD process.

The upper electrode 450 may include doped semiconductor, conductive metal nitride, metal, metal silicide, conductive oxide, or a combination thereof. For example, the upper electrode 450 may include TiN, TiAlN, TaN, TaAlN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCo), or a combination thereof.

A capacitor may be formed by the lower electrode 430E, the dielectric film 440, and the upper electrode 450.

An exemplary method of forming the plurality of lower electrodes LE of the integrated circuit device 400 shown in FIG. 14 by using the integrated circuit device manufacturing method according to the exemplary embodiment is described with reference to FIGS. 15A through 15H. In an embodiment, the integrated circuit device manufacturing method according to the exemplary embodiment may be advantageously applied to a trimming process for defining the plurality of active regions ACT of the integrated circuit device 400 shown in FIG. 14, a process of forming the plurality of direct contacts DC, and a process of forming the plurality of buried contacts BC.

Figure 16:
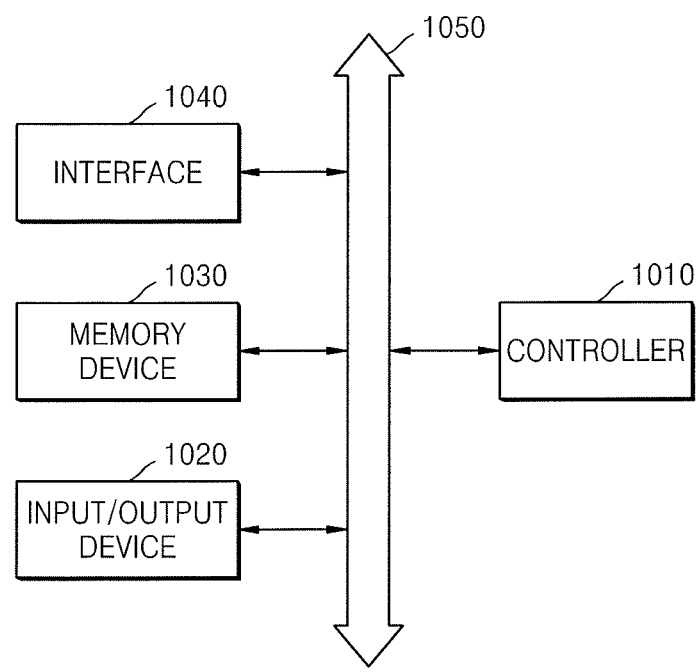
FIG. 16 illustrates a block diagram of a system including an integrated circuit device, according to an exemplary embodiment.

FIG. 16 illustrates a block diagram of a system 1000 including an integrated circuit device, according to an exemplary embodiment.

The system 1000 may include a controller 1010, an input/output device 1020, a memory device 1030, and an interface 1040. The system 1000 may be a mobile system or a system that transmits or receives information. In some exemplary embodiments, the mobile system may be a personal digital assistant (PDA), a portable computer, a web tablet, a wireless phone, a mobile phone, a digital music player, or a memory card. The controller 1010 for controlling a program executed in the system 1000 may include, for example, a microprocessor, a digital signal processor, or a microcontroller. The input/output device 1020 may be used to input or output data of the system 1000. The system 1000 may be connected to an external device such as a personal computer or a network by using the input/output device 1020, and may exchange data with the external device. The input/output device 1020 may be, for example, a keypad, a keyboard, or a display device.

The memory device 1030 may store code and/or data for operating the controller 1010, or may store data processed by the controller 1010. The memory device 1030 may include at least one integrated circuit obtained by using a method of forming a pattern or a method of manufacturing an integrated circuit device, according to the previous exemplary embodiments. For example, the memory device 1030 may include at least one integrated circuit device obtained by using one of the pattern formation methods described with reference to FIGS. 1A through 2F, the integrated circuit device manufacturing methods described with reference to FIGS. 3 through 15H, and methods modified or changed therefrom.

The interface 1040 may be a transmission path through which data is transmitted between the system 1000 and the external device. The controller 1010, the input/output device 1020, the memory device 1030, and the interface 1040 may communicate with one another via a bus 1050. The system 1000 may be used in a mobile phone, an MP3 player, a navigation system, a portable multimedia player (PMP), a solid-state disc (SSD), or a household appliance.

Figure 17:
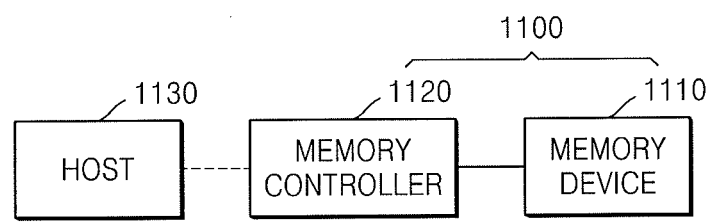
FIG. 17 illustrates a block diagram of a memory card including an integrated circuit device, according to an exemplary embodiment.

FIG. 17 illustrates a block diagram of a memory card 1100 including an integrated circuit device, according to an exemplary embodiment.

The memory card 1100 may include a memory device 1110 and a memory controller 1120.

The memory device 1110 may store data. In some exemplary embodiments, the storage unit 11110 may be nonvolatile, and it may retain stored data even when powered off. The memory device 1110 may include at least one integrated circuit device obtained by using a method of forming a pattern or a method of manufacturing an integrated circuit device, according to the previous exemplary embodiments. For example, the memory device 1110 may include at least one integrated circuit device obtained by using one of the pattern formation methods described with reference to FIGS. 1A through 2F, the integrated circuit device manufacturing methods described with reference to FIGS. 3 through 15H, and methods modified or changed therefrom.

The memory controller 1120 may read data stored in the memory device 1110 or may store data in the memory device 1110 in response to a read/write request of a host 1130. The memory controller 1120 may include at least one integrated circuit device obtained by using any method according to the previous exemplary embodiments. For example, the memory controller 1120 may include at least one integrated circuit device obtained by using one of the pattern formation methods described with reference to FIGS. 1A through 2F, the integrated circuit device manufacturing methods described with reference to FIGS. 3 through 15H, and methods modified or changed therefrom.

By way of summation and review, a polystyrene (PS) brush may be exposed in the outside of a cell boundary when a directed self-assembly (DSA) chemoepitaxy process is performed, and when a block copolymer layer is formed on the PS brush and the formed block copolymer layer is phase-separated, unwanted contact may occur at the cell boundary. As a result, a dummy pattern may be formed at the cell boundary, and a chip area may not be effectively used.

Provided is a method of processing a cell boundary in a process of manufacturing a semiconductor device using DSA chemoepitaxy. In DSA chemoepitaxy, a substrate may be processed with a PS-brush, and a contact may not be formed outside a cell boundary, and only a region outside the cell boundary may be processed with PMMA to reduce a chip penalty. When a PS-brush is formed as a brush layer of a substrate, an outer portion of a cell boundary, in which there may not be PMMA guiding pattern, may not be vertically aligned, and a trimming process may not be required. In a region outside the cell boundary, a PMMA brush may be exposed and PMMA, instead of PS, may become a background, and a contact may not occur at the cell boundary. As a result, a chip penalty may be reduced.

Embodiments relate to a method of forming a pattern by using a block copolymer and a method of manufacturing an integrated circuit device by using the method. The method may form a pattern, which may have a nanoscale critical dimension (CD) that ranges from several to tens of nanometers (nm).

Embodiments may provide a method of forming a pattern which may easily form a plurality of patterns that are repeatedly formed at fine pitches in order to form a pattern that may be necessary to manufacture a highly integrated semiconductor device exceeding a resolution limit in a photolithography process. Embodiments may provide a method of easily manufacturing an integrated circuit device including a plurality of patterns that are repeatedly formed at fine pitches in a limited area.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a pattern, the method comprising:
forming a feature layer on a substrate having a first region and a second region, the feature layer covering the first region and the second region;
forming a first guide pattern on the first region, the first guide pattern having a plurality of openings therein, the plurality of openings exposing a plurality of first local regions of an upper surface of the feature layer, the first local regions being spaced apart from one another;
forming a second guide pattern covering the feature layer exposed through the first guide pattern on the first region and covering the second region;
forming a block copolymer layer covering the first guide pattern and the second guide pattern on the first region and the second region;
phase-separating the block copolymer layer to form a plurality of first vertical domains and a second vertical domain, the plurality of first vertical domains being self-aligned on the plurality of first local regions and a plurality of second local regions between the plurality of first local regions using the second guide pattern as a guide, on the first region, the plurality of first vertical domains including a first polymer block, and the second vertical domain surrounding the plurality of first vertical domains on the first guide pattern, the second vertical domain including a second polymer block;
removing the plurality of first vertical domains on the first region; and
etching the first guide pattern and the feature layer using the second vertical domain as an etch mask on the first region to form a feature pattern having a plurality of holes therein.

2. The method as claimed in claim 1, wherein, in phase-separating the block copolymer layer, a layered structure, in which a first horizontal domain including the first polymer block and a second horizontal domain including the second polymer block are alternately self-assembled at least one time on the second guide pattern on the second region, is formed at a same time as the plurality of first vertical domains and the second vertical domain are formed.

3. The method as claimed in claim 2, wherein the layered structure is formed such that the second horizontal domain is exposed on an upper surface of the layered structure, and in etching the feature layer, the second guide pattern and the feature layer are etched using the second vertical domain and the second horizontal domain as an etch mask.

4. The method as claimed in claim 1, wherein the first polymer block includes poly(methyl methacrylate), poly(ethylene oxide), poly(lactic acid), or polyisoprene, and the second polymer block includes polystyrene.

5. The method as claimed in claim 1, wherein the first guide pattern includes a material having a relatively higher affinity for the second polymer block among the first polymer block and the second polymer block, and the second guide pattern includes a material having a relatively higher affinity for the first polymer block among the first polymer block and the second polymer block.

6. The method as claimed in claim 1, wherein the first guide pattern includes polystyrene, and the second guide pattern includes poly(methyl methacrylate), poly(ethylene oxide), poly(lactic acid), or polyisoprene.

7. The method as claimed in claim 1, wherein the block copolymer layer includes a pure block copolymer including the first polymer block and the second polymer block, the first polymer block includes poly(methyl methacrylate), poly(ethylene oxide), poly(lactic acid), or polyisoprene, and the second polymer block includes polyisoprene.

8. The method as claimed in claim 1, wherein forming the first guide pattern includes:
forming a first guide layer on the feature layer on the first region and the second region;
forming a mask pattern having a plurality of openings therein, the plurality of openings in the mask pattern exposing a plurality of regions including portions of an upper surface of the first guide layer, which corresponds to the plurality of first local regions, on the first guide layer in the first region;
forming a plurality of mask spacers covering sidewalls of the mask pattern in the first region; and
etching the first guide layer in the first region and the second region using the mask pattern and the plurality of mask spacers as an etch mask to form the first guide pattern in the first region and remove the first guide layer in the second region.

9. The method as claimed in claim 8, wherein the first guide layer and each of the plurality of mask spacers include polyisoprene.

10. The method as claimed in claim 8, wherein the first guide layer and the plurality of mask spacers include different materials.

11. The method as claimed in claim 1, wherein the plurality of first local regions form a hexagonal array in which the plurality of first local regions are regularly arranged with a first pitch, and the plurality of holes formed in the feature pattern form a hexagonal array in which the plurality of holes are regularly arranged with a second pitch that is less than the first pitch.

12. A method of manufacturing an integrated circuit device, the method comprising:
forming a feature layer on a substrate having a cell array region and a peripheral circuit region, the feature layer covering the cell array region and the peripheral circuit region;
forming a first guide pattern having a plurality of openings therein, the plurality of openings exposing a plurality of first local regions of an upper surface of the feature layer in the cell array region, the plurality of first local regions being spaced apart from one another;
forming a second guide pattern covering the feature layer exposed through the first guide pattern in the cell array region and covering the peripheral circuit region;
forming a block copolymer layer covering the first guide pattern and the second guide pattern in the cell array region and the peripheral circuit region;
phase-separating the block copolymer layer to form a plurality of first vertical domains and a second vertical domain, the second vertical domain surrounding the plurality of first vertical domains, in the cell array region and to form a layered structure, in which a first horizontal domain and a second horizontal domain are alternately self-assembled in a direction away from the substrate, in the peripheral circuit region;
removing the plurality of first vertical domains; and
etching the first guide pattern and the feature layer using the second vertical domain and the layered structure as an etch mask to form a feature pattern having a plurality of holes therein in the cell array region.

13. The method as claimed in claim 12, wherein the second guide pattern, the first vertical domain, and the first horizontal domain each include a first polymer, and the first guide pattern, the second vertical domain, and the second horizontal domain each include a second polymer having a structure that is different from that of the first polymer.

14. The method as claimed in claim 12, wherein forming the first guide pattern includes:

forming a first guide layer on the feature layer in the cell array region, the first guide layer including a polymer having a same structure as a polymer included in the second vertical domain;

forming a mask pattern on the first guide layer;

forming a plurality of mask spacers covering sidewalls of the mask pattern; and etching the first guide layer using the mask pattern and the plurality of mask spacers as an etch mask to expose a portion of the feature layer.

15. The method as claimed in claim 12, further comprising:

forming a mold layer on the substrate before etching the feature layer, and after etching the feature layer, forming a plurality of holes, the plurality of holes penetrating the mold layer, by etching the mold layer using the feature pattern as an etch mask; and forming a plurality of electrodes in the plurality of holes.

16. A method of manufacturing a semiconductor device, the method comprising:

forming a first guide pattern on a first region of a substrate, the first guide pattern having a plurality of openings therein, the first guide pattern including polystyrene;

forming a second guide pattern in the plurality of openings in the first guide pattern on the first region and covering a second region of the substrate, the second guide pattern including poly(methyl methacrylate);

forming a block copolymer layer covering the first guide pattern and the second guide pattern on the first region and the second region;

phase-separating the block copolymer layer to form a phase-separated block copolymer including:

a plurality of first vertical domains and a second vertical domain on the first region, the plurality of first vertical domains including a first polymer block, the second vertical domain surrounding the plurality of first vertical domains, the second vertical domain including a second polymer block; and a layered structure on the second region, the layered structure including a first horizontal domain including the first polymer block and a second horizontal domain on the first horizontal domain, the second horizontal domain including the second polymer block; and selectively removing the plurality of first vertical domains on the first region.

17. The method as claimed in claim 16, wherein selectively removing the plurality of first vertical domains on the first region includes:

selectively decomposing the plurality of first vertical domains by applying a polymer decomposer to the phase-separated block copolymer, and stripping off decomposed first vertical domains using a cleaning solution.

18. The method as claimed in claim 17, wherein the polymer decomposer includes radiant rays or plasma.

19. The method as claimed in claim 18, wherein a volume ratio of the first polymer block to the second polymer block in the block copolymer is about 20:80 to about 40:60.

20. The method as claimed in claim 19, wherein:

the first polymer block is poly(methyl methacrylate); and the second polymer block is polystyrene.

\* \* \* \* \*